US012581973B2

(12) United States Patent
Murayama

(10) Patent No.: US 12,581,973 B2
(45) Date of Patent: Mar. 17, 2026

(54) SEMICONDUCTOR DEVICE

(71) Applicant: SHINKO ELECTRIC INDUSTRIES CO., LTD., Nagano (JP)

(72) Inventor: Kei Murayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 545 days.

(21) Appl. No.: 18/085,177

(22) Filed: Dec. 20, 2022

(65) Prior Publication Data

US 2023/0207443 A1     Jun. 29, 2023

(30) Foreign Application Priority Data

Dec. 23, 2021     (JP) .................................. 2021-209839

(51) Int. Cl.
| | |
|---|---|
| *H01L 23/498* | (2006.01) |
| *H01L 23/00* | (2006.01) |
| *H01L 23/31* | (2006.01) |

(52) U.S. Cl.
CPC .... *H01L 23/49844* (2013.01); *H01L 23/3135* (2013.01); *H01L 23/49816* (2013.01); *H01L 23/49833* (2013.01); *H01L 24/08* (2013.01); *H01L 24/32* (2013.01); *H01L 2224/08235* (2013.01); *H01L 2224/32225* (2013.01); *H01L 2924/13091* (2013.01); *H01L 2924/182* (2013.01); *H01L 2924/186* (2013.01)

(58) Field of Classification Search
CPC ........... H01L 23/49844; H01L 23/3135; H01L 23/49816; H01L 23/49833; H01L 24/08; H01L 24/32
See application file for complete search history.

(56) References Cited

U.S. PATENT DOCUMENTS

| | | | | | |
|---|---|---|---|---|---|
| 8,299,592 | B2 * | 10/2012 | Suh | ......................... | H01L 24/17 |
| | | | | | 257/276 |
| 10,971,431 | B2 * | 4/2021 | Yamauchi | ........... | H01L 23/3731 |
| 11,089,693 | B2 * | 8/2021 | Yang | .................. | H01M 10/425 |
| 11,817,381 | B2 * | 11/2023 | Murayama | ........ | H01L 23/49833 |

(Continued)

FOREIGN PATENT DOCUMENTS

| | | |
|---|---|---|
| DE | 112016005397 T5 | 8/2018 |
| JP | 2013069942 A | 4/2013 |

(Continued)

OTHER PUBLICATIONS

European Search Report (EESR) for corresponding 22214050.1, completed Jun. 27, 2023, pp. 1-13.

*Primary Examiner* — Eugene Lee
(74) *Attorney, Agent, or Firm* — Tarolli, Sundheim, Covell & Tummino LLP

(57) ABSTRACT

A semiconductor device includes a lower substrate, a semiconductor element mounted on an upper surface of the lower substrate, an upper substrate disposed on an upper surface of the semiconductor element, one or more through holes extending through the upper substrate in a thickness-wise direction, an encapsulation resin disposed between the lower substrate and the upper substrate and encapsulating the semiconductor element, a wiring layer disposed on an upper surface of the upper substrate, and a covering resin covering the upper surface of the upper substrate and filling the through holes.

14 Claims, 17 Drawing Sheets

(56)         References Cited

U.S. PATENT DOCUMENTS

| | | | |
|---|---|---|---|
| 2010/0027228 | A1  | 2/2010 | Tsukada et al. |
| 2012/0013007 | A1* | 1/2012 | Hwang ................. H01L 25/105 |
| | | | 257/738 |
| 2015/0115466 | A1* | 4/2015 | Kim .................... H01L 23/3121 |
| | | | 257/774 |
| 2016/0113076 | A1* | 4/2016 | Davenport ......... H01R 33/7692 |
| | | | 315/201 |
| 2018/0096968 | A1* | 4/2018 | Lee ..................... H01L 25/0652 |
| 2018/0226356 | A1* | 8/2018 | Ikeda ..................... H01L 25/18 |
| 2020/0098734 | A1* | 3/2020 | Jeong ................. H01L 23/3121 |
| 2021/0193621 | A1* | 6/2021 | Chang .................... H01L 24/19 |

FOREIGN PATENT DOCUMENTS

| | | | |
|---|---|---|---|
| JP | 2018120902 | A | 8/2018 |
| JP | 2019153607 | A | 9/2019 |

* cited by examiner

SEMICONDUCTOR DEVICE

CROSS-REFERENCE TO RELATED APPLICATIONS

This application is based upon and claims the benefit of priority from prior Japanese Patent Application No. 2021-209839, filed on Dec. 23, 2021, the entire contents of which are incorporated herein by reference.

FIELD

This disclosure relates to a semiconductor device.

BACKGROUND

A power semiconductor device (power module) is a known semiconductor device that controls and supplies power. This type of semiconductor device may include a lower substrate, an upper substrate, a semiconductor element mounted between the lower substrate and the upper substrate, an encapsulation resin disposed between the lower substrate and the upper substrate to encapsulate the semiconductor element, and a wiring layer formed on the upper surface of the upper substrate and electrically connected to the semiconductor element.

Japanese Laid-Open Patent Publication No. 2018-120902 discloses a prior art related to such a semiconductor device.

In the semiconductor device, the semiconductor element and the upper substrate may greatly differ in coefficient of thermal expansion (CTE). In this case, when the semiconductor device is heated during a temperature cycle test or the like, the difference in coefficient of thermal expansion between the semiconductor element and the upper substrate causes the upper substrate to easily separate from the semiconductor element.

SUMMARY

An embodiment of a semiconductor device includes a lower substrate, a semiconductor element mounted on an upper surface of the lower substrate, an upper substrate disposed on an upper surface of the semiconductor element, one or more through holes extending through the upper substrate in a thickness-wise direction, an encapsulation resin disposed between the lower substrate and the upper substrate and encapsulating the semiconductor element, a wiring layer disposed on an upper surface of the upper substrate, and a covering resin covering the upper surface of the upper substrate and filling the through holes.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
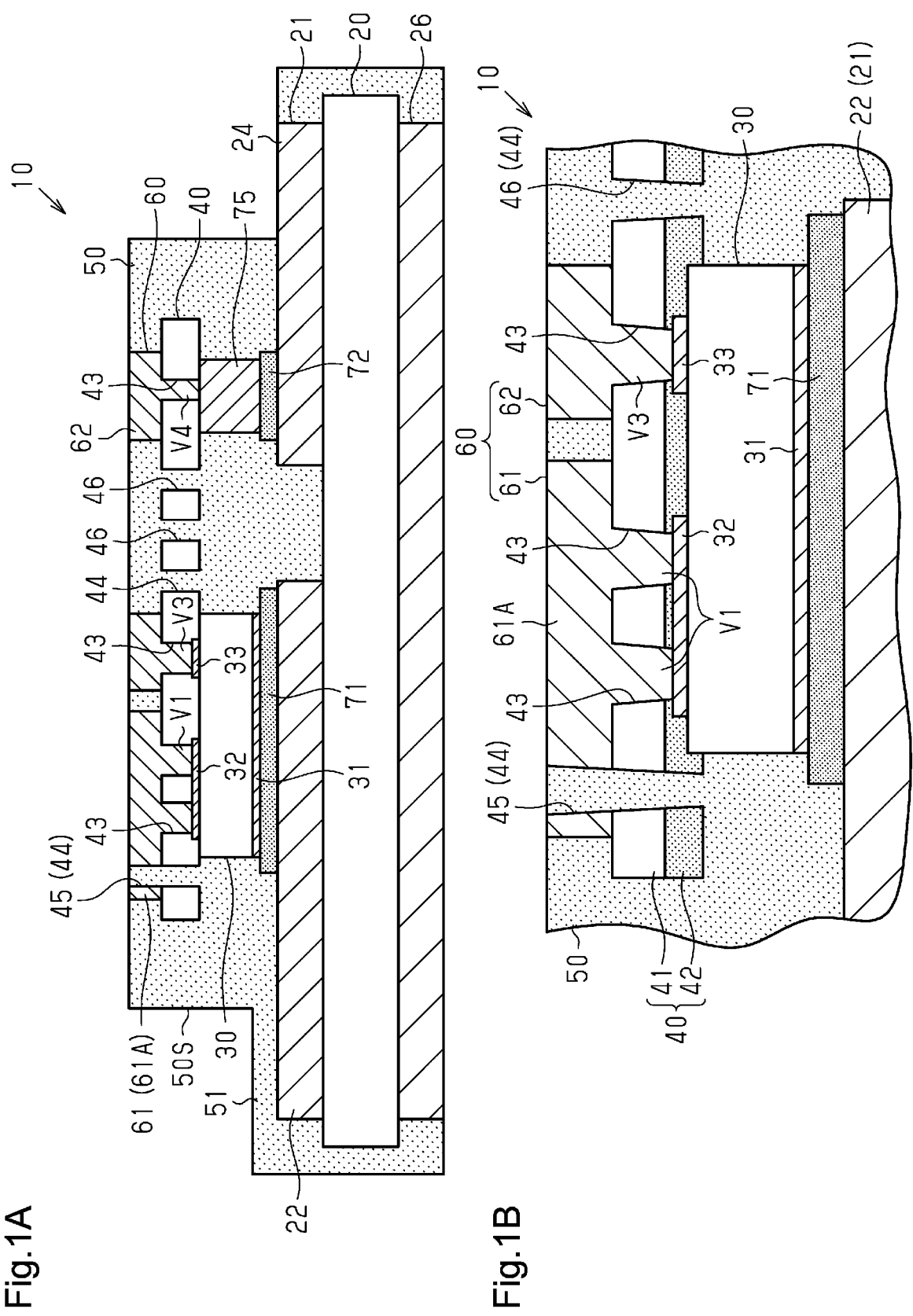
FIG. 1A is a schematic cross-sectional view illustrating an embodiment of a semiconductor device (cross-sectional view taken along line 1-1 in FIGS. 2 and 3)
FIG. 1B is an enlarged cross-sectional partial view of the semiconductor device illustrated in FIG. 1A.

Various embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "plan view" refers to a view of a subject taken in a vertical direction (for example, upper-lower direction in FIG. 1A), and "planar shape" refers to a shape of a subject viewed in the vertical direction. In this specification, the frame of reference for "the vertical direction" and "the sideward direction" is each drawing positioned so that the reference characters are properly read. The terms "parallel" and "orthogonal" in this specification are not limited to exactly parallel and orthogonal and include generally parallel and orthogonal within the scope in which the operation and advantages of the embodiment are obtained.

General Structure of Semiconductor Device 10

The general structure of a semiconductor device 10 will now be described with reference to FIG. 1A.

The semiconductor device 10 is, for example, a power semiconductor device (power module) that controls and supplies power. An example of the semiconductor device 10 is a DC-DC converter. The semiconductor device 10 includes a lower substrate 20, one or more (in the present embodiment, two) semiconductor elements 30 mounted on an upper surface of the lower substrate 20, and an upper substrate 40 disposed on an upper surface of the semiconductor elements 30. The semiconductor device 10 includes an encapsulation resin 50 disposed between the lower substrate 20 and the upper substrate 40 to encapsulate the semiconductor elements 30 and a wiring layer 60 electrically connected to the semiconductor elements 30 and disposed on the upper surface of the upper substrate 40. The semiconductor elements 30 are disposed between the upper surface of the lower substrate 20 and the lower surface of the upper substrate 40. The semiconductor device 10 incorporates the semiconductor elements 30 between the lower substrate 20 and the upper substrate 40.

The semiconductor device 10 further includes a covering resin disposed on the upper surface of the upper substrate 40 to cover a side surface of the wiring layer 60. In the present embodiment, the covering resin is part of the encapsulation resin 50 and is formed of the same resin material as that of the encapsulation resin 50. However, the covering resin and the encapsulation resin 50 may be formed from different resin materials. The covering resin may be formed from a material having a coefficient of thermal expansion similar to that of the encapsulation resin 50.

In this specification, "similar" as in "coefficient of thermal expansion similar" means that the difference in coefficient of thermal expansion between the encapsulation resin 50 and the covering resin is included in a range that is less than or equal to 10 ppm/° C. In an example, the coefficient of thermal expansion of the encapsulation resin 50 may be approximately 5 ppm/° C. to 18 ppm/° C., and the coefficient of thermal expansion of the covering resin may be approximately 5 ppm/° C. to 28 ppm/° C. In an example, the coefficient of thermal expansion of the covering resin is set so that the difference in coefficient of thermal expansion between the covering resin and the encapsulation resin 50 is less than the difference in coefficient of thermal expansion between the covering resin and the semiconductor elements 30. In an example, the coefficient of thermal expansion of the covering resin is set so that the difference in coefficient of thermal expansion between the covering resin and the encapsulation resin 50 is less than the difference in coefficient of thermal expansion between the covering resin and the upper substrate 40.

Structure of Semiconductor Element 30

Each semiconductor element 30 is formed from, for example, silicon (Si) or silicon carbide (SiC). The semiconductor element 30 is, for example, a power semiconductor element. For example, an insulated gate bipolar transistor (IGBT), a metal-oxide-semiconductor field-effect transistor (MOSFET), or a diode may be used as the semiconductor element 30. In the present embodiment, the semiconductor element 30 is a MOSFET. The semiconductor element 30 may have any planar shape and any planar size. An example of the planar shape of the semiconductor element 30 is rectangular. The thickness of the semiconductor element 30 may be in a range of, for example, 50 μm to 600 μm. The coefficient of thermal expansion of the semiconductor element 30 may be in a range of, for example, 3 ppm/° C. to 6 ppm/° C.

The semiconductor element 30 includes, for example, an electrode pad 31, an electrode pad 32, and an electrode pad 33. The electrode pad 31 is formed, for example, on the lower surface of the semiconductor element 30. In an example, the electrode pad 31 covers the entire lower surface of the semiconductor element 30. The electrode pads 32 and 33 are formed, for example, on the upper surface of the semiconductor element 30. The electrode pads 32 and 33 are separately disposed on the upper surface of the semiconductor element 30. The electrode pad 31 is, for example, a drain electrode of the MOSFET. The electrode pad 32 is, for example, a source electrode of the MOSFET. The electrode pad 33 is, for example, a gate electrode of the MOSFET.

The material of the electrode pads 31, 32, and 33 may be, for example, a metal such as aluminum (Al) or copper (Cu) or an alloy including at least one selected from a group consisting of these metals. A surface-processed layer may be formed on surfaces of the electrode pads 31, 32, and 33 where appropriate. Examples of the surface-processed layer include a gold (Au) layer, a nickel (Ni) layer/Au layer (metal layer formed by stacking the Ni layer and the Au layer in this order), and a Ni layer/palladium (Pd) layer/Au layer (metal layer formed by stacking the Ni layer, the Pd layer, and the Au layer in this order). Each of the Au layer, the Ni layer, and the Pd layer may be, for example, a metal layer formed through an electroless plating process (electroless plated metal layer). The Au layer is a metal layer formed with Au or an Au alloy, the Ni layer is a metal layer formed with Ni or a Ni alloy, and the Pd layer is a metal layer formed with Pd or a Pd alloy.

Structure of Lower Substrate 20

The lower substrate 20 is plate-shaped. The lower substrate 20 is, for example, a ceramic substrate formed from ceramic such as an oxide ceramic or a non-oxide ceramic. Examples of oxide ceramics include aluminum oxide ($Al_2O_3$) and zirconia ($ZrO_2$). Examples of non-oxide ceramics include aluminum nitride (AlN) and silicon nitride ($Si_3N_4$). The coefficient of thermal expansion of the lower substrate 20 may be in a range of, for example, 2 ppm/° C. to 7 ppm/° C.

The lower substrate 20 may have any planar shape and any planar size. In an example, the planar shape of the lower substrate 20 is rectangular. The thickness of the lower substrate 20 may be in a range of, for example, 200 μm to 400 μm.

Structure of Wiring Layer 21

Figure 2:
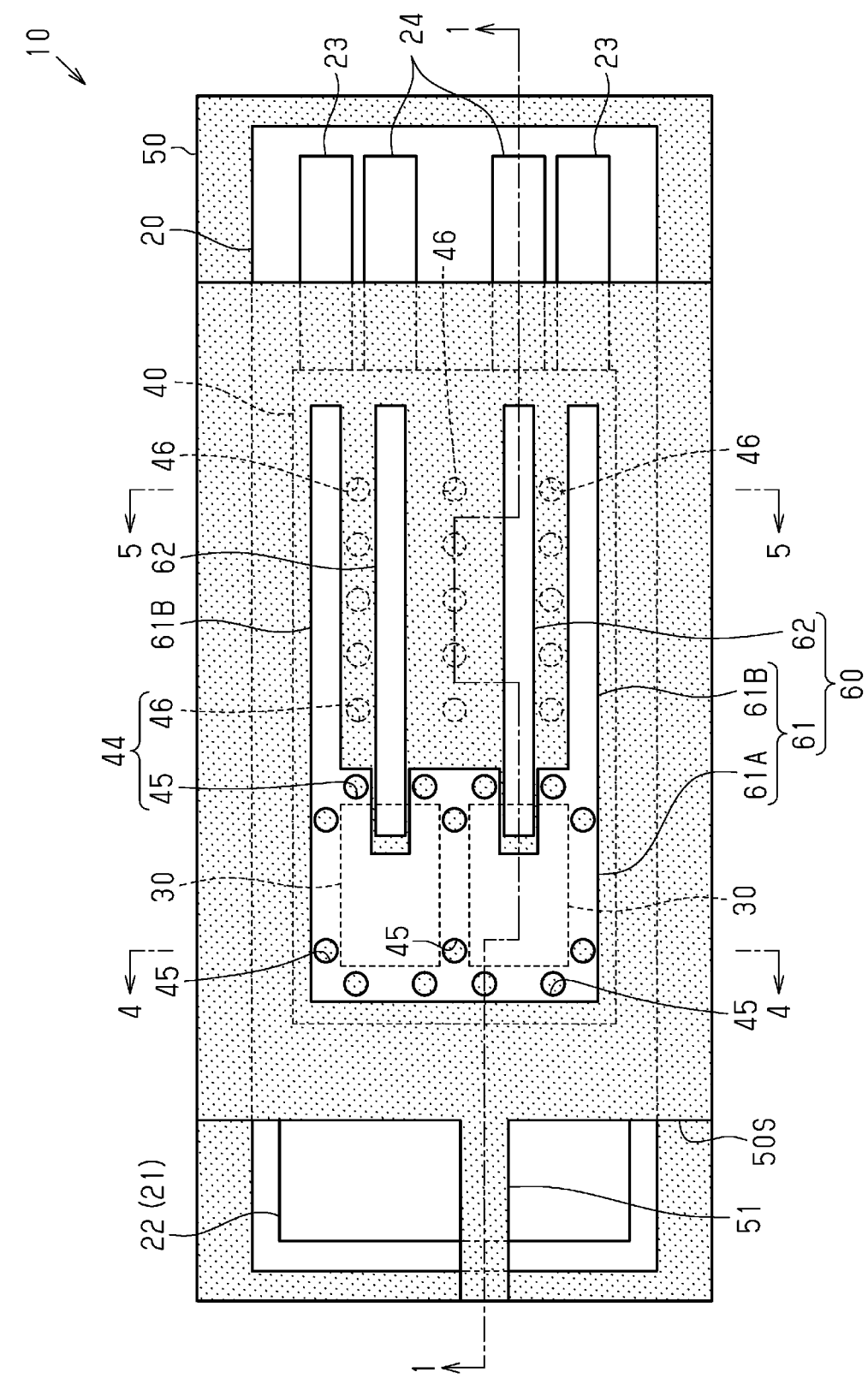
FIGS. 2 and 3 are schematic plan views of the semiconductor device illustrated in FIG. 1A.
Figure 3:
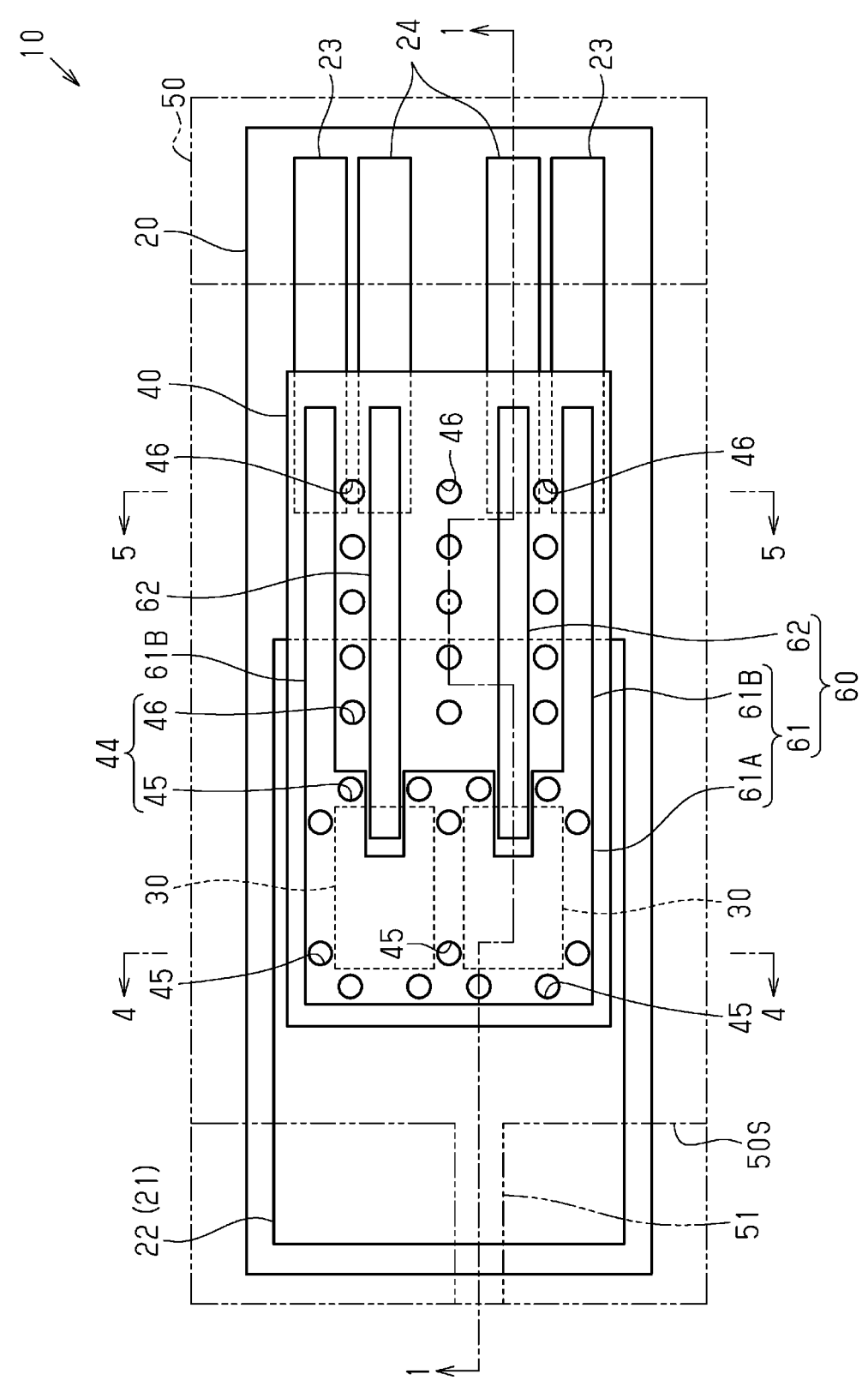

As illustrated in FIGS. 2 and 3, for example, a wiring layer 21 is formed on the upper surface of the lower substrate 20. In an example, the wiring layer 21 includes one or more (in the present embodiment, one) wiring pattern 22, one or more (in the present embodiment, two) wiring patterns 23, and one or more (in the present embodiment, two) wiring patterns 24. FIGS. 2 and 3 are plan views of the semiconductor device 10 illustrated in FIG. 1A viewed from above. In FIG. 3, the encapsulation resin 50 is transparent.

The material of the wiring patterns 22, 23, and 24 may be, for example, copper or a copper alloy. A surface-processed layer may be formed on surfaces (upper and side surfaces or only upper surface) of the wiring patterns 22, 23, and 24 where appropriate. The surface-processed layer may be a metal layer such as an Au layer, a Ni layer/Au layer, and a Ni layer/Pd layer/Au layer. The coefficient of thermal expansion of the wiring layer 21 may be in a range of, for example, 15 ppm/° C. to 18 ppm/° C. The thickness of each of the wiring patterns 22, 23, and 24 may be in a range of, for example, 100 μm to 800 μm.

As illustrated in FIG. 3, the wiring patterns 22, 23, and 24 are separately disposed on the upper surface of the lower substrate 20. The wiring patterns 22, 23, and 24 may have any planar shape and any planar size.

An example of the planar shape of the wiring pattern 22 is rectangular. In an example, the wiring pattern 22 is greater in planar size than each of the wiring patterns 23 and 24. The wiring pattern 22 is, for example, formed in a solid manner.

In an example, as illustrated in FIG. 3, the wiring pattern 22 entirely extends over an approximately left half region of the upper surface of the lower substrate 20. In an example, a portion of the wiring pattern 22 overlaps the upper substrate 40 in plan view. The wiring pattern 22 is, for example, electrically connected to the electrode pad 31 (refer to FIG. 1A) of the semiconductor element 30.

An example of the planar shape of each wiring pattern 23 is rectangular. In an example, the wiring pattern 23 has a given width in the vertical direction in FIG. 3 and extends like a belt in the sideward direction in FIG. 3. In an example, the two wiring patterns 23 are disposed at an outer side of the wiring patterns 24 in the vertical direction in FIG. 3. In an example, the two wiring patterns 23 are disposed at opposite sides of the two wiring patterns 24 in the vertical direction in FIG. 3. In an example, a portion of each wiring pattern 23 overlaps the upper substrate 40 in plan view. In an example, the wiring pattern 23 is electrically connected to the electrode pad 32 (refer to FIG. 1A) of the semiconductor element 30.

In an example, the planar shape of each wiring pattern 24 is rectangular. In an example, the wiring pattern 24 has a given width in the vertical direction in FIG. 3 and extends like a belt in the sideward direction in FIG. 3. In an example, the wiring patterns 24 extend parallel to the wiring patterns 23. In an example, the two wiring patterns 24 are disposed at an inner side of the wiring patterns 23 in the vertical direction in FIG. 3. In an example, a portion of each wiring pattern 24 overlaps the upper substrate 40 in plan view. In an example, the wiring pattern 24 is electrically connected to the electrode pad 33 (refer to FIG. 1A) of the semiconductor element 30.

Structure of Metal Layer 26

As illustrated in FIG. 1A, for example, a metal layer 26 is formed on the lower surface of the lower substrate 20. The metal layer 26 may have any planar shape and any planar size. An example of the planar shape of the metal layer 26 is rectangular. The metal layer 26 is, for example, formed in a solid manner In an example, the metal layer 26 extends on the entire lower surface excluding the peripheral edges of the lower substrate 20. The metal layer 26 is used as, for example, a reinforcement layer that restrains warping of the lower substrate 20. The metal layer 26 may be used as, for example, a heat dissipation member.

The material of the metal layer 26 may be, for example, copper or a copper alloy. A surface-processed layer may be formed on a surface (lower and side surfaces or only the lower surface) of the metal layer 26 where appropriate. The surface-processed layer may be a metal layer such as an Au layer, a Ni layer/Au layer, and a Ni layer/Pd layer/Au layer. The thickness of the metal layer 26 may be in a range of, for example, 100 μm to 800 μm. The thickness of the metal layer 26 is, for example, smaller than the thickness of the wiring layer 21.

Structure of Bonding Portion 71

Each semiconductor element 30 is bonded to the upper surface of the wiring pattern 22 via a bonding portion 71 having an electrical conductivity. The bonding portion 71 is bonded to the wiring pattern 22 and the electrode pad 31. The bonding portion 71 electrically connects the wiring pattern 22 to the electrode pad 31 of the semiconductor element 30.

Figure 4:
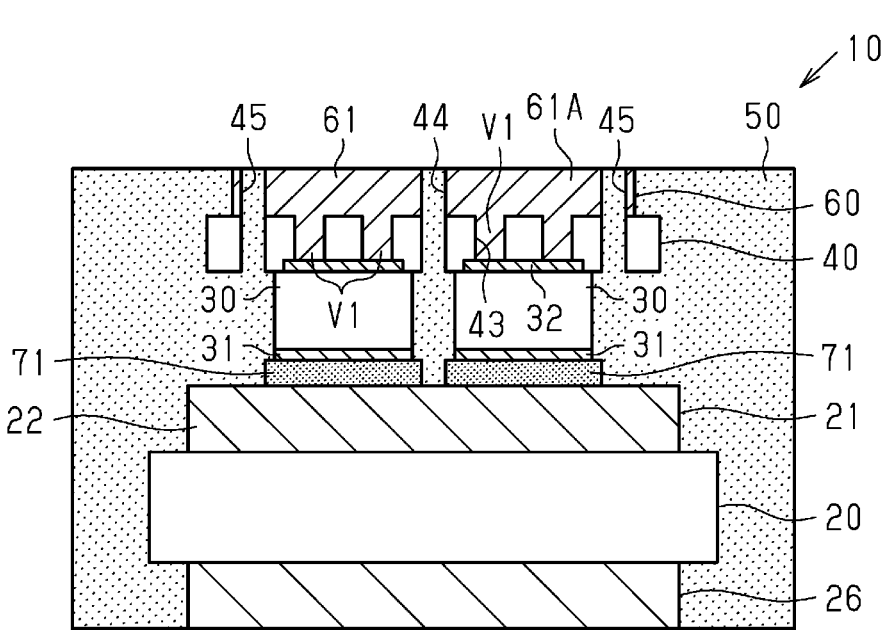
FIG. 4 is a cross-sectional view taken along line 4-4 in FIGS. 2 and 3.

As illustrated in FIG. 4, for example, a separate bonding portion 71 is arranged for each semiconductor element 30. In the present embodiment, each bonding portion 71 is bonded to the electrode pad 31 of the semiconductor element 30 and the wiring pattern 22. Thus, the electrode pad 31 and the wiring pattern 22 are electrically connected via the bonding portion 71.

The semiconductor element 30 is bonded to the upper surface of the wiring pattern 22 via the bonding portion 71. In an example, the two semiconductor elements 30 are separated from each other in a planar direction (sideward direction in FIG. 4) that is orthogonal to the stacking direction (vertical direction in FIG. 4) of the semiconductor device 10. The two semiconductor elements 30 are arranged next to each other in the sideward direction in FIG. 4. The two semiconductor elements 30 have, for example, the same thickness. The two semiconductor elements 30 may have, for example, the same planar shape and the same planar size. As illustrated in FIG. 3, for example, the entirety of each semiconductor element 30 overlaps the wiring pattern 22 in plan view. The entirety of the semiconductor element 30 overlaps, for example, the upper substrate 40 in plan view.

Structure of Bonding Portion 72

Figure 5:
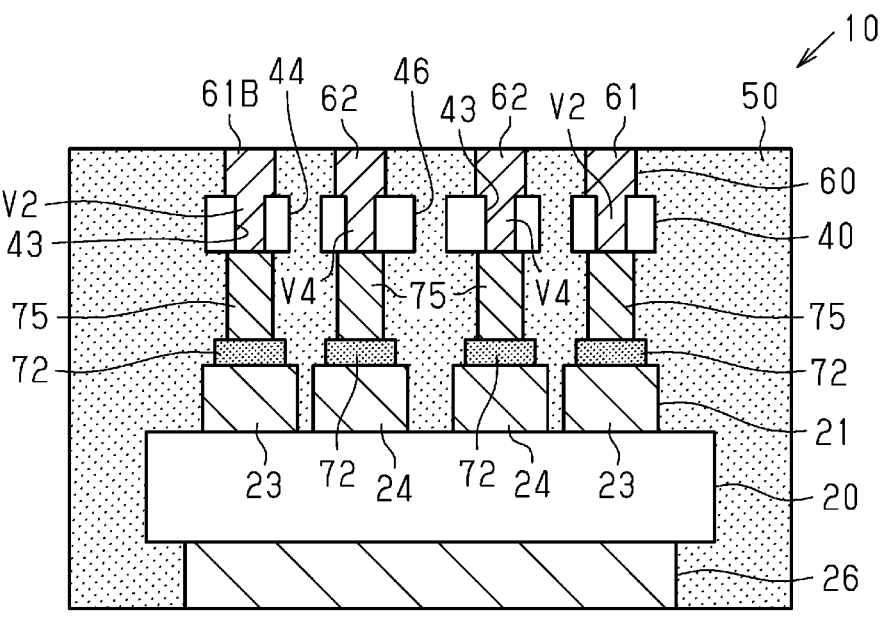
FIG. 5 is a cross-sectional view taken along line 5-5 in FIGS. 2 and 3.

As illustrated in FIG. 5, bonding portions 72 having electrical conductivity are formed on the upper surfaces of the wiring patterns 23 and 24. A connection member 75 is formed on the upper surface of each bonding portion 72. The bonding portion 72 is bonded to the connection member 75 and one of the wiring patterns 23 and the wiring patterns 24. Some of the bonding portions 72 electrically connect the wiring patterns 23 and the connection members 75. Some of the bonding portions 72 electrically connect the wiring patterns 24 to the connection members 75.

The material of the bonding portions 71 and 72 may be, for example, a metal sintering material. The sintering material may be, for example, a sintering material having silver (Ag) particles as a main component (silver sintering material) or a sintering material having copper particles as a main component (copper sintering material). The material of the bonding portions 71 and 72 may be, for example, solder, a conductive paste such as a silver paste, or a brazing metal. The thickness of the bonding portions 71 and 72 may be in a range of, for example, 10 μm to 60 μm.

Structure of Connection Member 75

The connection members 75 are electrically connected to the wiring layer 60, which is formed on the upper surface of the upper substrate 40. Thus, the wiring patterns 23 and 24 are electrically connected to the wiring layer 60 via the bonding portions 72 and the connection members 75. The connection members 75 are, for example, rod-shaped and extend in the stacking direction (vertical direction in FIG. 5) of the semiconductor device 10. The connection members 75 are, for example, metal posts. As illustrated in FIG. 1A, for example, the connection member 75 and the semiconductor element 30 have the same thickness. The thickness of the connection member 75 may be in a range of, for example, 50 μm to 775 μm. For example, the upper surface of the connection member 75 is flush with the upper surface of the semiconductor element 30. The material of the connection member 75 may be, for example, copper or a copper alloy.

Structure of Upper Substrate 40

The upper substrate 40 is disposed on the upper surface of the semiconductor element 30 and the upper surface of the connection member 75. The upper substrate 40 is plate-shaped. The upper substrate 40 may have any planar shape and any planar size. As illustrated in FIG. 3, an example of the planar shape of the upper substrate 40 is rectangular. In an example, the upper substrate 40 is smaller in planar shape than the lower substrate 20. In an example, the dimension of the upper substrate 40 in the sideward direction in FIG. 3 is smaller than the dimension of the lower substrate 20 in the sideward direction in FIG. 3. In an example, the dimension of the upper substrate 40 in the vertical direction in FIG. 3 is smaller than the dimension of the lower substrate 20 in the vertical direction in FIG. 3. In an example, the entirety of the upper substrate 40 overlaps the lower substrate 20 in plan view.

As illustrated in FIG. 1B, the upper substrate 40 includes, for example, a substrate body 41 and an adhesive layer 42 formed on the lower surface of the substrate body 41. The material of the substrate body 41 may be, for example, an insulative resin such as a polyimide resin or a polyester resin. The adhesive layer 42 may be, for example, an epoxy-based, polyimide-based, or silicone-based adhesive. The coefficient of thermal expansion of the upper substrate 40 may be in a range of, for example, 20 ppm/° C. to 27 ppm/° C. The thickness of the substrate body 41 may be in a range of, for example, 30 μm to 50 μm. The thickness of the adhesive layer 42 may be in a range of, for example, 15 μm to 45 μm.

The substrate body 41 is, for example, adhered to the semiconductor element 30 by the adhesive layer 42. The adhesive layer 42 is adhered to the upper surface of the semiconductor element 30 and the lower surface of the substrate body 41. In an example, a portion of the semiconductor element 30 extends in the adhesive layer 42. In other words, a portion of the semiconductor element 30 is embedded in the adhesive layer 42. In an example, the electrode pads 32 and 33 of the semiconductor element 30 are embedded in the adhesive layer 42. In an example, an upper portion of the semiconductor element 30 is embedded in the adhesive layer 42. In an example, the adhesive layer 42 covers a side surface of the upper portion of the semiconductor element 30.

Openings 43 extend through the upper substrate 40 in the thickness-wise direction of the upper substrate 40. In an example, the openings 43 extend through the substrate body 41 and the adhesive layer 42 in the thickness-wise direction. As illustrated in FIG. 1B, in an example, each opening 43 is tapered so that the width (diameter) of the opening 43 is decreased from the upper side (the upper surface of the upper substrate 40) toward the lower side (the lower substrate 20). In an example, the opening 43 has the form of an inverted truncated cone so that the lower open end has a smaller diameter than the upper open end. In an example, one or more of the openings 43 partially expose the upper surface of the electrode pads 32 and 33. As illustrated in FIG. 1A, in an example, one or more of the openings 43 partially expose the upper surface of the connection member 75.

One or more through holes 44 extend through the upper substrate 40 in the thickness-wise direction of the upper substrate 40. In an example, the through holes 44 extend through the substrate body 41 and the adhesive layer 42 in the thickness-wise direction. In an example, the through holes 44 are arranged so as not to overlap the semiconductor elements 30 and the connection members 75 in plan view.

Structure of Wiring Layer 60

The wiring layer 60 is formed on the upper surface of the upper substrate 40. The wiring layer 60 includes one or more (in the present embodiment, one) wiring pattern 61 and one or more (in the present embodiment, two) wiring patterns 62.

The material of the wiring patterns 61 and 62 may be, for example, copper or a copper alloy. A surface-processed layer may be formed on surfaces (upper and side surfaces or only upper surface) of the wiring patterns 61 and 62 where appropriate. The surface-processed layer may be a metal layer such as an Au layer, a Ni layer/Au layer, and a Ni layer/Pd layer/Au layer. The coefficient of thermal expansion of the wiring layer 60 may be in a range of, for example, 15 ppm/° C. to 18 ppm/° C. The thickness of the wiring patterns 61 and 62 may be in a range of, for example, 50 μm to 200 μm.

As illustrated in FIGS. 2 and 3, the wiring patterns 61 and 62 are separately disposed on the upper surface of the upper substrate 40. The wiring patterns 61 and 62 may have any planar shape and any planar size.

Structure of Wiring Pattern 61

In an example, the wiring pattern 61 includes a main body 61A and extensions 61B extending from the main body 61A in a planar direction. In an example, the main body 61A has a rectangular planar shape. In an example, the main body 61A overlaps the semiconductor elements 30 in plan view. In an example, the main body 61A overlaps the electrode pad 32 (refer to FIG. 1A) of the semiconductor element 30 in plan view.

As illustrated in FIG. 1B, for example, via wirings V1 are formed in the openings 43, which partially expose the upper surface of the electrode pad 32, and the main body 61A of the wiring pattern 61 is electrically connected to the electrode pad 32 via the via wirings V1. In an example, the wiring pattern 61 is formed integrally with the via wirings V1. In the present embodiment, the wiring pattern 61 is formed integrally with a plurality of via wirings V1. In an example, the via wirings V1 are separately arranged in the planar direction (sideward direction in FIG. 1B). In an example, each via wiring V1 fills the opening 43. The via wiring V1 extends through the substrate body 41 and the adhesive layer 42 of the upper substrate 40 in the thickness-wise direction.

As illustrated in FIG. 3, in an example, each extension 61B extends from a side surface of the main body 61A that is opposed to the wiring patterns 62 toward the wiring patterns 23. In an example, the two extensions 61B are formed on opposite ends of the main body 61A in the vertical direction in FIG. 3. In an example, each extension 61B extends in the sideward direction in FIG. 3. In an example, the extension 61B has a distal end that extends to overlap the wiring pattern 23 in plan view. In an example, the planar shape of the extension 61B is rectangular. In an example, the planar shape of the extension 61B has a given width in the vertical direction in FIG. 3 and extends like a belt in the sideward direction in FIG. 3.

As illustrated in FIG. 5, in an example, a via wiring V2 is formed in the opening 43, which partially exposes the upper surface of the connection member 75, and the extension 61B of the wiring pattern 61 is electrically connected to the connection member 75 via the via wiring V2. In an example, the wiring pattern 61 is formed integrally with the via wiring V2. In an example, the via wiring V2 fills the opening 43. The wiring pattern 61 is electrically connected to the wiring pattern 23 via the via wiring V2, the connection member 75, and the bonding portion 72. Thus, the wiring pattern 23 is electrically connected to the electrode pad 32 (source electrode) of the semiconductor element 30 via the bonding portion 72, the connection member 75, the via wiring V2, the wiring pattern 61, and the via wiring V1 illustrated in FIG. 1B.

Structure of Wiring Pattern 62

As illustrated in FIG. 3, in an example, the planar shape of each wiring pattern 62 is rectangular. In an example, the wiring pattern 62 has a given width in the vertical direction in FIG. 3 and extends like a belt in the sideward direction in FIG. 3. In an example, the wiring pattern 62 extends parallel to the extensions 61B of each wiring pattern 61. In an example, the two wiring patterns 62 are disposed at an inner side of the extensions 61B of the wiring pattern 61 in the vertical direction in FIG. 3. Each wiring pattern 62 has a first end (left end in FIG. 3) that overlaps a portion of the semiconductor element 30 in plan view.

As illustrated in FIG. 1A, the wiring pattern 62 is disposed so that the first end overlaps the electrode pad 33 of the semiconductor element 30 in plan view. In an example, a via wiring V3 is formed in the opening 43, which partially exposes the upper surface of the electrode pad 33, and the first end of the wiring pattern 62 is electrically connected to the electrode pad 33 via the via wiring V3. In an example, the wiring pattern 62 is formed integrally with the via wiring V3. In an example, each via wiring V3 fills the opening 43.

As illustrated in FIG. 3, each wiring pattern 62 has a second end (right end in FIG. 3) that is opposite to the first end. In an example, the wiring pattern 62 extends so that the second end overlaps the wiring pattern 24 in plan view.

As illustrated in FIG. 5, in an example, a via wiring V4 is formed in the opening 43, which partially exposes the upper surface of the connection member 75, and the second end of each wiring pattern 62 is electrically connected to the connection member 75 via the via wiring V4. In an example, the wiring pattern 62 is formed integrally with the via wiring V4. In an example, the via wiring V4 fills the opening 43. The wiring pattern 62 is electrically connected to the wiring pattern 24 via the via wiring V4, the connection member 75, and the bonding portion 72. Thus, the wiring pattern 24 is electrically connected to the electrode pad 33 (gate electrode) of the semiconductor element 30 via the bonding portion 72, the connection member 75, the via wiring V4, the wiring pattern 62, and the via wiring V3, which is illustrated in FIG. 1A.

Structure of Through Hole 44

As illustrated in FIGS. 2 and 3, in an example, the through holes 44 include one or more first through holes 45 and one or more second through holes 46. In plan view, the first through holes 45 are arranged in the vicinity of the semiconductor elements 30, that is, near the semiconductor elements 30. In plan view, the second through holes 46 are arranged in the vicinity of the wiring layer 60. The term "vicinity" may mean, for example, "adjacent." In the present embodiment, the through holes 44 include fourteen first through holes 45 and fifteen second through holes 46.

Structure of First Through Hole 45

In an example, the first through holes 45 are arranged in the vicinity of the corners of each semiconductor element 30 in plan view. In the present embodiment, the first through holes 45 are arranged in the vicinity of each one of the four corners of each semiconductor element 30. In an example, in plan view, the first through holes 45 are arranged in the vicinity of each one of the four sides defining the outer shape of each semiconductor element 30. In the present embodiment, two of the first through holes 45 are arranged for each of the four sides defining the outer shape of the semiconductor element 30. That is, two first through holes 45 are arranged in the vicinity of each side of the semiconductor element 30. In an example, the two first through holes 45 arranged in the vicinity of each side of the semiconductor element 30 are located in the vicinity of different two corners of the semiconductor element 30. In other words, each one of the four corners of the semiconductor element 30 is provided with two first through holes 45. In FIGS. 2 and 3, in an example, two first through holes 45 are arranged between the two semiconductor elements 30, which are located next to each other in the vertical direction, and are shared by the two semiconductor elements 30. That is, in FIGS. 2 and 3, the two first through holes 45 are shared by the lower side of the upper semiconductor element 30 and the upper side of the lower semiconductor element 30.

Each first through hole 45 may have any planar shape and any planar size. The planar shape of the first through hole 45 is, for example, circular. The first through holes 45 may have the same planar shape or different planar shapes.

As illustrated in FIG. 1B, in an example, the first through holes 45 extend through the upper substrate 40 and the wiring layer 60 in the thickness-wise direction. In an example, the first through holes 45 extend through the substrate body 41, the adhesive layer 42, and the wiring pattern 61 in the thickness-wise direction. In an example, the first through holes 45 extend through the main body 61A of the wiring pattern 61 in the thickness-wise direction. In an example, the first through holes 45 extend deeper than the second through holes 46. In an example, as illustrated in FIG. 1B, each first through hole 45 is tapered so that the width (diameter) of the first through hole 45 is decreased from the upper side (the wiring pattern 61) toward the lower side (the lower substrate 20). In an example, the first through hole 45 has the form of an inverted truncated cone so that the lower open end has a smaller diameter than the upper open end. In an example, the first through hole 45 is defined by a wall surface that is inclined toward the planar center of the first through hole 45 as the first through hole 45 extends from the upper surface of the wiring pattern 61 toward the lower surface of the adhesive layer 42. In an example, the wall surface of the first through hole 45 is flat and linearly inclined without steps in the thickness-wise direction of the substrate body 41, the adhesive layer 42, and the wiring pattern 61. That is, in the example illustrated in FIG. 1B, the wall surface of each first through hole 45 is inclined at a fixed angle. The wall surface of the first through hole 45 does not necessarily have to be flat. The wall surface of the first through hole 45 may partially or entirely have an outward curve or an inward curve.

Structure of Second Through Hole 46

As illustrated in FIGS. 2 and 3, for example, the second through holes 46 are arranged in the vicinity of the wiring layer 60 without overlapping the wiring layer 60 in plan view. In plan view, for example, the second through holes 46 are arranged in the vicinity of the extensions 61B of the wiring pattern 61 or the wiring patterns 62. In an example, in plan view, the second through holes 46 are arranged at a given interval in the extension direction of the extensions 61B (sideward direction in FIGS. 2 and 3). In the present embodiment, five second through holes 46 are arranged at a given interval in the extension direction of each extension 61B. In an example, of the five second through holes 46 arranged in the extension direction of each extension 61B, one second through hole 46 is located in the vicinity of the distal end of the extension 61B in plan view. In an example, in plan view, the second through holes 46 are arranged at a given interval in the extension direction of the wiring pattern 62 (sideward direction in FIGS. 2 and 3). In the present embodiment, five second through holes 46 are arranged at a given interval in the extension direction of the wiring pattern 62. In an example, in plan view, of the five second through holes 46 arranged in the extension direction of the wiring patterns 62, one second through hole 46 is located in the vicinity of the second end (right end in FIGS. 2 and 3) of the wiring pattern 62. In FIGS. 2 and 3, in an example, five second through holes 46 are arranged between the two wiring patterns 62, which are located next each other in the vertical direction, are shared by the two wiring patterns 62.

Each second through hole 46 may have any planar shape and any planar size. The planar shape of the second through hole 46 is, for example, circular. The second through holes 46 may have the same planar shape or different planar shapes.

As illustrated in FIG. 1B, in an example, each second through hole 46 extends through the upper substrate 40 in the thickness-wise direction. In an example, the second through hole 46 extends through the substrate body 41 and the adhesive layer 42 in the thickness-wise direction. As illustrated in FIG. 1B, in an example, the second through hole 46 is tapered so that the width (diameter) of the second through hole 46 is decreased from the upper side (the upper surface of the upper substrate 40) toward the lower side (the lower substrate 20). In an example, the second through hole 46 has the form of an inverted truncated cone so that the lower open end has a smaller diameter than the upper open end. In an example, the second through hole 46 is defined by a wall surface that is inclined toward the planar center of the second through hole 46 as the wall surface extends from the upper surface of the substrate body 41 toward the lower surface of the adhesive layer 42. In an example, the wall surface of the second through hole 46 is flat and linearly inclined without steps in the thickness-wise direction of the substrate body 41 and the adhesive layer 42. That is, in the example illustrated in FIG. 1B, the wall surface of each second through hole 46 is inclined at a fixed angle. The wall surface of the second through hole 46 does not necessarily have to be flat. The wall surface of the second through hole 46 may partially or entirely have an outward curve or an inward curve.

Structure of Encapsulation Resin 50

As illustrated in FIG. 1A, the encapsulation resin 50, for example, encapsulates the semiconductor elements 30, the connection members 75, and the bonding portions 71 and 72, which are disposed between the lower substrate 20 and the upper substrate 40. In an example, the encapsulation resin 50 collectively encapsulates the semiconductor elements 30. For example, the encapsulation resin 50 covers the side surfaces of the semiconductor elements 30, the side surfaces of the connection members 75, the upper surfaces of the bonding portions 71 exposed from the semiconductor elements 30, the side surfaces of the bonding portions 71, the upper surfaces of the bonding portions 72 exposed from the connection members 75, and the side surfaces of the bonding portions 72. The encapsulation resin 50, for example, covers the side surface of the wiring layer 21, and the upper surface of the lower substrate 20 exposed from the wiring layer 21 in portions overlapping the upper substrate 40 in plan view.

In an example, the encapsulation resin 50 covers a portion of the wiring layer 21 that does not overlap the upper substrate 40 in plan view. In an example, the encapsulation resin 50 exposes a portion of the wiring layer 21 that does not overlap the upper substrate 40 in plan view. In an example, the encapsulation resin 50 covers a portion of the upper surface of the lower substrate 20 that does not overlap the upper substrate 40 in plan view. As illustrated in FIG. 2, in an example, the encapsulation resin 50 exposes a portion of the upper surface of the lower substrate 20 that does not overlap the upper substrate 40 in plan view. In an example, the encapsulation resin 50 covers a side surface of the lower substrate 20. In an example, the encapsulation resin 50 covers the entirety of the side surfaces of the lower substrate 20. In an example, the encapsulation resin 50 continuously covers the side surfaces of the lower substrate 20. In an example, the encapsulation resin 50 surrounds the lower substrate 20 from outside.

As illustrated in FIG. 1A, in an example, the encapsulation resin 50 covers the lower surface of the lower substrate 20. In an example, the encapsulation resin 50 covers the entirety of the lower surface of the lower substrate 20 exposed from the metal layer 26. In an example, the encapsulation resin 50 covers a side surface of the metal layer 26. In an example, the encapsulation resin 50 covers the entirety of the side surfaces of the metal layer 26. In an example, the encapsulation resin 50 exposes the lower surface of the metal layer 26. In an example, the lower surface of the encapsulation resin 50 is flush with the lower surface of the metal layer 26.

In an example, the encapsulation resin 50 covers a side surface of the upper substrate 40. In an example, the encapsulation resin 50 covers the entirety of the side surfaces of the upper substrate 40. As illustrated in FIG. 2, in an example, the encapsulation resin 50 continuously covers the side surfaces of the upper substrate 40. In an example, the encapsulation resin 50 surrounds the upper substrate 40 from outside.

In an example, the encapsulation resin 50 covers the upper surface of the upper substrate 40. In an example, the encapsulation resin 50 covers the entirety of the upper surface of the upper substrate 40 exposed from the wiring layer 60. As illustrated in FIG. 1A, in an example, the encapsulation resin 50 covers a side surface of the wiring layer 60. In an example, the encapsulation resin 50 covers the entirety of the side surfaces of the wiring layer 60. In an example, the encapsulation resin 50 is in contact with the side surfaces of the wiring layer 60. In an example, the encapsulation resin 50 surrounds the wiring patterns 61 and 62. In an example, the encapsulation resin 50 exposes the upper surface of the wiring layer 60. In an example, the upper surface of the encapsulation resin 50 is flush with the upper surface of the wiring layer 60.

As illustrated in FIG. 1B, the encapsulation resin 50 fills the through holes 44. The encapsulation resin 50 also fills the first through holes 45. The portions of the encapsulation resin 50 filling the first through holes 45 have the same shape as the first through holes 45 (in the example illustrated in FIG. 1B, inverted truncated cone). The encapsulation resin 50 continuously covers the adhesive layer 42, the substrate body 41, and the wiring pattern 61, which define the wall surfaces of the first through holes 45. The encapsulation resin 50 is in contact with the wall surfaces of the first through holes 45. In an example, the portions of the encapsulation resin 50 filling the first through holes 45 are formed continuously and integrally with the portion of the encapsulation resin 50 encapsulating the semiconductor elements 30. In an example, the portions of the encapsulation resin 50 filling the first through holes 45 are formed continuously and integrally with the portion of the encapsulation resin 50 covering the side surfaces of the semiconductor elements 30. In an example, the upper surface of the encapsulation resin 50 filling the first through holes 45 is flush with the upper surface of the wiring layer 60.

The encapsulation resin 50 fills the second through holes 46. The portions of the encapsulation resin 50 filling the second through holes 46 have the same shape as the second through holes 46 (in the example illustrated in FIG. 1B, inverted truncated cone). The encapsulation resin 50 continuously covers the substrate body 41 and the adhesive layer 42, which define the wall surfaces of the second through holes 46. The encapsulation resin 50 is in contact with the wall surfaces of the second through holes 46. In an example, the portions of the encapsulation resin 50 filling the second through holes 46 are formed continuously and integrally with the portion of the encapsulation resin 50 covering the lower surface of the upper substrate 40 and the portion of the encapsulation resin 50 covering the upper surface of the upper substrate 40. That is, the portions of the encapsulation resin 50 filling the second through holes 46 integrally connect the portion of the encapsulation resin 50 covering the lower surface of the upper substrate 40 and the portion of the encapsulation resin 50 covering the upper surface of the upper substrate 40.

As illustrated in FIG. 1A, in an example, the encapsulation resin 50 includes an extension 51 extending in the planar direction (sideward direction in FIG. 1A) from a side surface 50S of the encapsulation resin 50 covering the wiring layer 21 exposed from the upper substrate 40. In an example, the extension 51 covers the upper surface of the wiring pattern 22 of the wiring layer 21. As illustrated in FIG. 2, in an example, the extension 51 extends from the side surface 50S to an outer side surface of the semiconductor device 10. In an example, the extension 51 has a given width in the vertical direction in FIG. 2 and extends like a belt in the sideward direction in FIG. 2.

The material of the encapsulation resin 50 may be, for example, a non-photosensitive insulative resin containing a thermosetting resin as a main component. The material of the encapsulation resin 50 may be, for example, an insulative resin, such as epoxy resin and polyimide resin, or a resin material obtained by mixing the resin with a filler such as silica and alumina. The encapsulation resin 50 may be, for example, a mold resin. The coefficient of thermal expansion of the encapsulation resin 50 may be in a range of, for example, 5 ppm/° C. to 18 ppm/° C.

The electrode pad 31 illustrated in FIG. 1A is drawn to the outside of the encapsulation resin 50 via the wiring pattern 22. The electrode pad 32 is drawn to the outside of the encapsulation resin 50 via the wiring pattern 61 and the wiring patterns 23 (refer to FIG. 3). The electrode pad 33 is drawn to the outside of the encapsulation resin 50 via the wiring patterns 62 and the wiring patterns 24. The wiring patterns 22, 23, and 24 drawn to the outside of the encapsulation resin 50 and exposed from the encapsulation resin 50 are used as test pads. The test pads will contact, for example, a probe pin of an electric property measuring device (not illustrated).

Manufacturing Method of Semiconductor Device 10

A method for manufacturing the semiconductor device 10 will now be described. To facilitate understanding, portions that ultimately become elements of the semiconductor device 10 are indicated by reference characters used to denote the final elements.

Figure 6A:
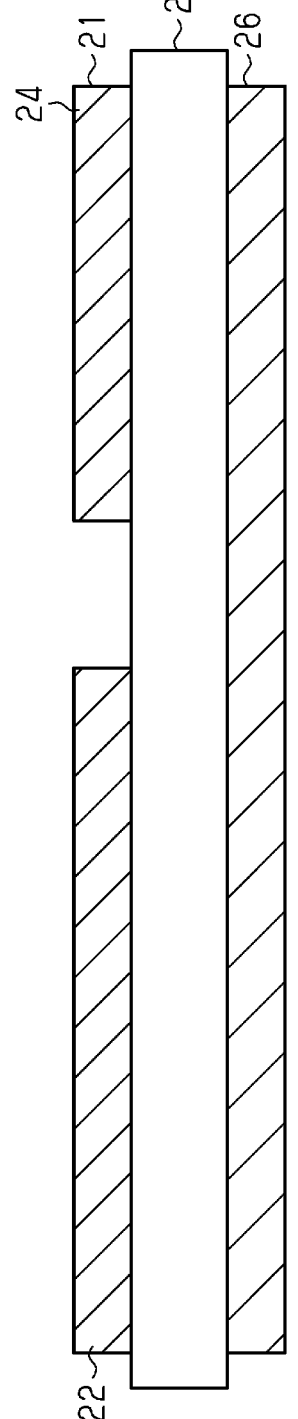
FIGS. 6A, 6B, 7A, and 7B are schematic cross-sectional views illustrating a method for manufacturing the semiconductor device illustrated in FIG. 1A.

In the step illustrated in FIG. 6A, the lower substrate 20 is prepared. The wiring layer 21 and the metal layer 26 are formed on the upper surface and the lower surface of the lower substrate 20, respectively. In this step, the wiring layer 21 includes the wiring pattern 22, the wiring patterns 23 (refer to FIG. 3), and the wiring patterns 24.

Figure 6B:
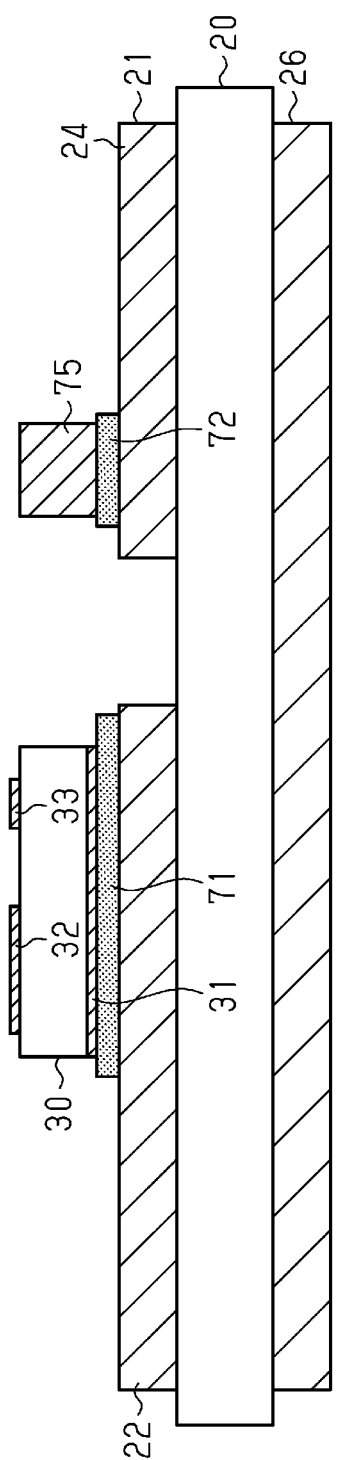

In the step illustrated in FIG. 6B, the bonding portions 71 and 72 are formed on the upper surface of the wiring layer 21. The bonding portions 71 and 72 may be formed, for example, by applying a paste of sintering material (sintering paste) through a printing process or a dispenser process. For example, a silver sintering paste, which is obtained by dispersing silver particles in an organic solvent, may be used as the sintering paste. For example, a screen-printing process or a stencil printing process may be used as the printing process.

Then, the semiconductor element 30 is mounted on the upper surface of the bonding portion 71, and the connection member 75 is mounted on the upper surface of the bonding portion 72. In this step, the semiconductor element 30 is mounted on the upper surface of the bonding portion 71 so that the electrode pad 31, which is formed on the lower surface of the semiconductor element 30, is formed on the upper surface of the bonding portion 71.

The bonding portions 71 and 72 are heated so that the bonding portions 71 and 72 are sintered. Consequently, the wiring pattern 22 of the wiring layer 21 and the electrode pad 31 of the semiconductor element 30 are bonded by the bonding portion 71. The semiconductor element 30 is bonded to the wiring pattern 22 via the bonding portion 71. Also, the wiring patterns 23 and 24 (refer to FIG. 5) of the wiring layer 21 and the connection members 75 are bonded by the bonding portions 72. The connection members 75 are bonded to the wiring patterns 23 and 24 via the bonding portions 72.

Figures 7A, 7B:
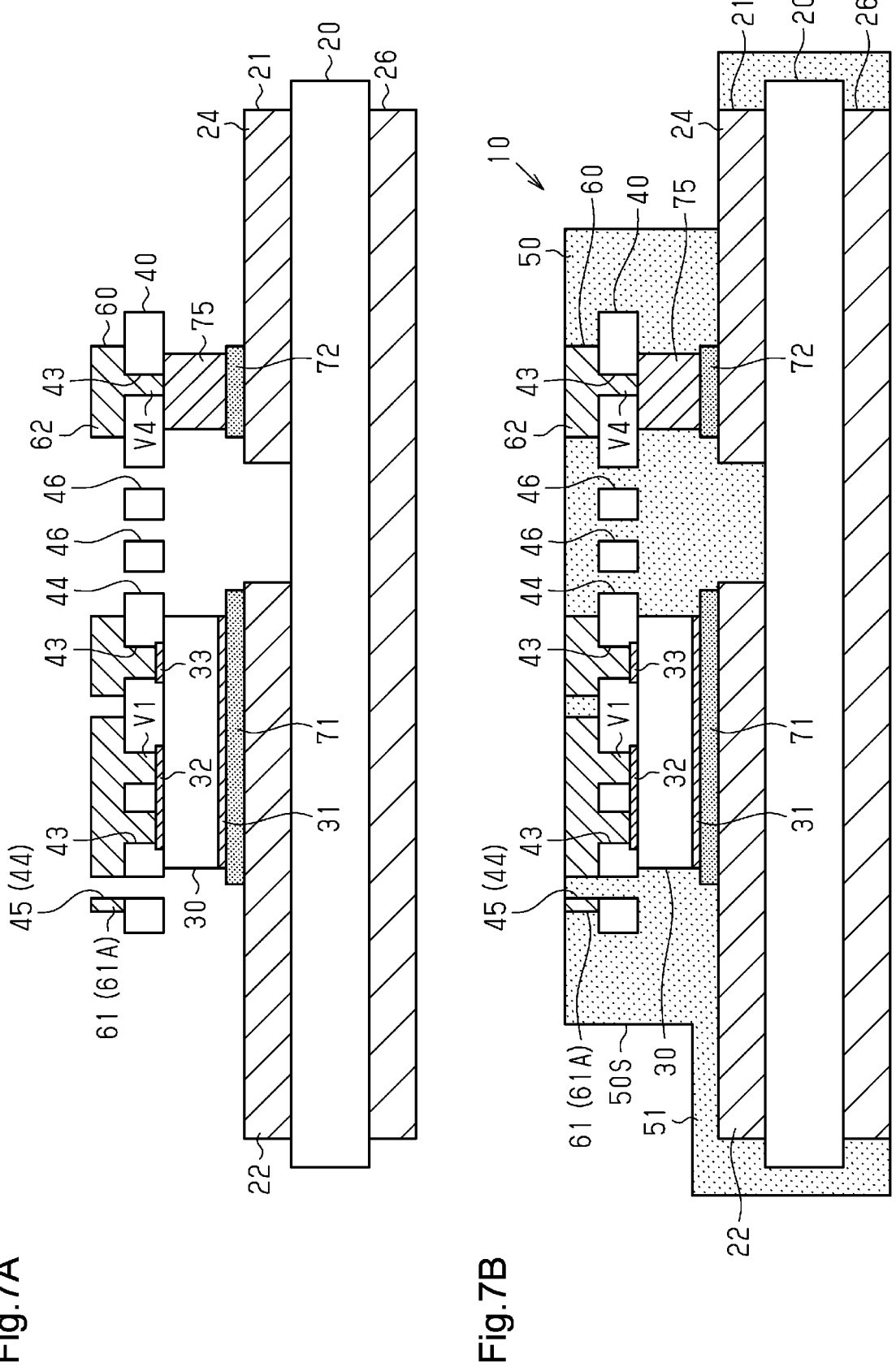

In the step illustrated in FIG. 7A, the upper substrate 40 is mounted on the upper surface of the semiconductor element 30 and the upper surface of the connection member 75. In an example, the upper substrate 40 is adhered to the upper surface of the semiconductor element 30 and the upper surface of the connection member 75 by the adhesive layer 42, which is illustrated in FIG. 1B. In an example, the upper surface of the semiconductor element 30 and the upper surface of the connection member 75 are laminated with a sheet of the upper substrate 40 through thermocompression bonding.

The openings 43 are formed in given positions of the upper substrate 40 to partially expose the upper surface of the electrode pads 32 and 33 of the semiconductor element 30 and the upper surface of the connection member 75. The openings 43 may be formed by, for example, laser cutting using a $CO_2$ laser or a UV-YAG laser. When the openings 43 are formed by laser cutting, a desmear process is performed to remove resin smears from the surfaces of the electrode pads 32 and 33 and the connection member 75 exposed in the bottom of the openings 43.

The via wirings V1 to V4 are formed in the openings 43. The wiring layer 60 is formed on the upper surface of the upper substrate 40 and is electrically connected to the electrode pads 32 and 33 and the connection members 75 via the via wirings V1 to V4. In this step, the wiring layer 60 includes the wiring pattern 61 and the wiring pattern 62. The via wirings V1 to V4 and the wiring layer 60 may be formed using various wiring forming processes, for example, a semi-additive process.

The through holes 44 are formed in given positions of the upper substrate 40. In an example, the first through holes 45 are formed in given positions of the upper substrate 40 and the wiring layer 60 so that the first through holes 45 extend through the upper substrate 40 and the wiring layer 60 in the thickness-wise direction. Also, the second through holes 46 are formed in given positions of the upper substrate 40 exposed from the wiring layer 60 so that the second through holes 46 extend through the upper substrate 40 in the thickness-wise direction. The first through holes 45 and the second through holes 46 may be formed by, for example, punching or laser cutting. In an example, the second through holes 46 and the openings 43 may be formed simultaneously. In an example, after the wiring layer 60, the via wirings V1 to V4, the first through holes 45, and the second through holes 46 are formed in the upper substrate 40, the upper substrate 40 may be mounted on the upper surface of the semiconductor element 30 and the upper surface of the connection member 75.

In the step illustrated in FIG. 7B, the encapsulation resin 50 is formed to encapsulate the semiconductor element 30 and the connection members 75, which are disposed between the lower substrate 20 and the upper substrate 40, cover the upper surface of the upper substrate 40, and fill the through holes 44. In addition, in an example, the encapsulation resin 50 covers the entirety of the upper substrate 40 and the side surfaces and the lower surface of the lower substrate 20. In an example, the encapsulation resin 50 fills the first through holes 45 and the second through holes 46. The encapsulation resin 50 may be formed, for example, through a resin molding process. In an example in which a thermosetting mold resin is used as the material of the encapsulation resin 50, a mold including a set of an upper mold part and a lower mold part is used so that the structural body illustrated in FIG. 7A is placed in the lower mold part and sandwiched by the upper mold part from above to accommodate the structural body in the mold. Then, a liquidized thermosetting mold resin is introduced into the mold through a gate (not illustrated) of the mold under pressure (for example, pressure in range of 5 MPa or greater and 10 MPa or less). Then, the mold resin is heated and cured at a temperature of approximately 180° C. to form the encapsulation resin 50. Although not illustrated in the drawings, the mold includes a passage that connects a region where the encapsulation resin 50 is formed to cover the side surfaces of the lower substrate 20 and a region where the encapsulation resin 50 is formed to cover the entirety of the upper substrate 40. Introduction of the mold resin into the passage forms the extension 51 in the encapsulation resin 50. Although not illustrated in the drawings, the upper mold part is in contact with the upper surface of the wiring layer 60, and the lower mold part is in contact with the lower surface of the metal layer 26. The mold resin introduced into the mold spreads through the passage into the cavity surrounded by the upper mold part and the lower mold part. In an example, the mold resin spreads into the space between the lower substrate 20 and the upper substrate 40 and the space between the upper substrate 40 and the upper mold part. In this step, the mold resin spreading into the space between the lower substrate 20 and the upper substrate 40 also spreads into the space between the upper substrate 40 and the upper mold part through the second through holes 46. Thus, the mold resin is distributed through the second through holes 46 to the space between the upper substrate 40 and the upper mold part. This allows the mold resin to appropriately fill a narrow space present between the upper substrate 40 and the upper mold part, which is, for example, a narrow space between the wiring pattern 61 and the wiring pattern 62. When the encapsulation process is completed, the structural body including the encapsulation resin 50 is taken out from the mold. The process for filling the mold with the mold resin includes, for example, a transfer molding, a compression molding, and an injection molding.

The manufacturing steps described above manufacture the semiconductor device 10 of the present embodiment. The semiconductor device 10 may be inverted when used or may be arranged at any angle.

The present embodiment has the advantages described below.

(1) The through holes 44 extend through the upper substrate 40 in the thickness-wise direction of the upper substrate 40. The encapsulation resin 50 disposed between the lower substrate 20 and the upper substrate 40 to encapsulate the semiconductor elements 30 covers the upper surface of the upper substrate 40 and fills the through holes 44. In this structure, both the upper surface and the lower surface of the upper substrate 40 are covered by the encapsulation resin 50, and the upper substrate 40 including the wall surfaces defining the through holes 44 are covered by the encapsulation resin 50. Thus, while the upper substrate 40 is sandwiched by the encapsulation resin 50 from above and below, the upper substrate 40 is joined to the encapsulation resin 50 in the thickness-wise direction of the upper substrate 40. The encapsulation resin 50 physically restricts movement of the upper substrate 40 in various directions (thickness-wise direction and planar direction). This reduces strain of the upper substrate 40 caused by the difference in coefficient of thermal expansion between the semiconductor element 30 and the upper substrate 40, for example, when the semiconductor device 10 is heated during a temperature cycle test or the like. As a result, separation of the upper substrate 40 from the semiconductor element 30 is appropriately limited.

(2) In addition, reduction in strain of the upper substrate 40 caused by the difference in coefficient of thermal expansion among the semiconductor element 30, the upper substrate 40, and the encapsulation resin 50 limits formation of cracks in the wiring layer 60, which is formed on the upper surface of the upper substrate 40. The reduction in strain of the upper substrate 40 also reduces stress exerted on the via wirings V1 to V4 by the strain. This limits formation of cracks in the via wirings V1 to V4.

(3) The upper substrate 40 includes the substrate body 41 and the adhesive layer 42, which is disposed on the lower surface of the substrate body 41. The through holes 44 extend through the substrate body 41 and the adhesive layer 42 in the thickness-wise direction. In this structure, the encapsulation resin 50 covers the substrate body 41 and the adhesive layer 42 including the wall surfaces defining the through holes 44. Thus, while the substrate body 41 and the adhesive layer 42 are sandwiched by the encapsulation resin 50 from above and below, the substrate body 41 and the adhesive layer 42 are joined to the encapsulation resin 50 in the thickness-wise direction of the upper substrate 40. This reduces strain of the adhesive layer 42 caused by the difference in coefficient of thermal expansion between the semiconductor element 30 and the adhesive layer 42, thereby appropriately limiting separation of the upper substrate 40 from the semiconductor element 30.

(4) The through holes 44 include the first through holes 45, which are arranged in the vicinity of the semiconductor element 30 in plan view. The first through holes 45 extend through the wiring layer 60 and the upper substrate 40 in the thickness-wise direction. In this structure, the first through holes 45 are arranged in the vicinity of the semiconductor element 30, where thermal stress is likely to be produced due to the difference in coefficient of thermal expansion between the semiconductor element 30 and the upper substrate 40. The first through holes 45 are filled with the encapsulation resin 50. The first through holes 45 and the encapsulation resin 50 filling the first through holes 45 appropriately reduce strain of the upper substrate 40 caused by the difference in coefficient of thermal expansion between the semiconductor element 30 and the upper substrate 40. As a result, separation of the upper substrate 40 from the semiconductor element 30 is further appropriately limited.

(5) The planar shape of the semiconductor element 30 is rectangular. In addition, the planar shape of the upper substrate 40 is rectangular. Each of the semiconductor elements 30 is disposed proximate to one of the four corners of the upper substrate 40 in plan view. The through holes 44 include first through holes 45 that are arranged in the vicinity of the corner of the semiconductor element 30 that is located closest to the one of the four corners of the upper substrate 40 in plan view. In this structure, the first through holes 45 are arranged in the vicinity of the corner of the semiconductor element 30 on which the thermal stress is most likely to concentrate among the four corners. The first through holes 45 are filled with the encapsulation resin 50. The first through holes 45 and the encapsulation resin 50 appropriately reduce strain of the upper substrate 40 caused by the difference in coefficient of thermal expansion between the semiconductor element 30 and the upper substrate 40.

(6) The first through holes 45 are arranged corresponding to each of the four corners of the semiconductor element 30. In other words, the first through holes 45 are arranged in the vicinity of each of the four corners of the semiconductor element 30. In this structure, in a peripheral region of the semiconductor element 30, thermal stress tends to concentrate on the corners of the semiconductor element 30. The first through holes 45 are arranged in the vicinity of the corners of the semiconductor element 30 and filled with the encapsulation resin 50. The first through holes 45 and the encapsulation resin 50 appropriately reduce strain of the upper substrate 40 caused by the difference in coefficient of thermal expansion between the semiconductor element 30 and the upper substrate 40.

(7) The through holes 44 include the second through holes 46, which are arranged in the vicinity of the wiring layer 60 without overlapping the wiring layer 60 in plan view. The second through holes 46 extend through the upper substrate 40 in the thickness-wise direction. The encapsulation resin 50 fills the second through holes 46. In this structure, the encapsulation resin 50 that fills the second through holes 46 is formed continuously with the encapsulation resin 50 that covers the upper surface of the upper substrate 40. Thus, the encapsulation resin 50 that covers the upper surface of the upper substrate 40 is joined to the encapsulation resin 50 that encapsulates the semiconductor elements 30 by the encapsulation resin 50 that fills the second through holes 46. In other words, the encapsulation resin 50 that sandwiches the upper substrate 40 from above and below is joined to the encapsulation resin 50 that fills the second through holes 46. The encapsulation resin 50 appropriately restricts movement of the upper substrate 40 in various directions. This appropriately reduces strain of the upper substrate 40 caused by the difference in coefficient of thermal expansion between the semiconductor element 30 and the upper substrate 40.

(8) The second through holes 46 facilitate the distribution of mold resin, for example, when forming the encapsulation resin 50. Thus, the mold resin appropriately fills even a narrow space such as that formed between the wiring pattern 61 and the wiring pattern 62. In an example, even when the mold resin has a low fluidity (i.e., high viscosity), the desired space is appropriately filled with the mold resin. In other words, for example, even when a narrow space is present between the wiring pattern 61 and the wiring pattern 62, the second through holes 46 allow for the use of a mold resin having a low fluidity to form the encapsulation resin 50. This increases the degree of freedom for selecting the material of mold resin.

(9) The second through holes 46 extend through the upper substrate 40 in the thickness-wise direction. This structure facilitates removal of gas through the second through holes 46. In an example, in the manufacturing process of the semiconductor device 10, when gas is produced inside such as in the encapsulation resin 50 during heating, the gas is released outside through the second through holes 46. This appropriately limits formation of voids in the encapsulation resin 50.

(10) The side surfaces of the wiring layer 60 are covered by the encapsulation resin 50. Thus, the encapsulation resin 50 physically restricts movement of the wiring layer 60. This reduces strain of the wiring layer 60, thereby appropriately limiting formation of cracks in the wiring layer 60.

(11) The portion of the encapsulation resin encapsulating the semiconductor elements 30, the portion of the encapsulation resin covering the upper surface of the upper substrate 40, and the portion of the encapsulation resin filling the through holes 44 are integrally formed of a single layer of the encapsulation resin 50. In this structure, the encapsulation resin 50 sandwiches the upper substrate 40 from above and below and also fills the through holes 44. This appropriately reduces strain of the upper substrate 40 caused by the difference in coefficient of thermal expansion among the encapsulation resin 50, the upper substrate 40, and the semiconductor element 30. Thus, separation of the upper substrate 40 from the semiconductor elements 30 is appropriately limited.

(12) The through hole 44 is tapered so that the opening width is decreased from the upper surface of the upper substrate 40 toward the lower surface. The portion of the encapsulation resin 50 filling the through hole 44 is tapered in the same manner as the through hole 44. The encapsulation resin 50 is disposed above and below the through holes 44, covers the upper substrate 40, and is integrated with the portion of the encapsulation resin 50 filling the through holes 44. Thus, the encapsulation resin 50 filling the through holes 44 restricts upward movement of the upper substrate 40, thereby appropriately limiting separation of the upper substrate 40 from the semiconductor element 30.

(13) The side surfaces of the upper substrate 40 are covered by the encapsulation resin 50. In this structure, the encapsulation resin 50 surrounds the periphery of the upper substrate 40. This appropriately reduces strain of the upper substrate 40 caused by the difference in coefficient of thermal expansion among the encapsulation resin 50, the upper substrate 40, and the semiconductor element 30.

(14) The side surfaces of the lower substrate 20 and the lower surface of the lower substrate 20 are covered by the encapsulation resin 50. In this structure, the encapsulation resin 50 surrounds the periphery of the lower substrate 20. This appropriately reduces strain of the lower substrate 20 caused by the difference in coefficient of thermal expansion between the encapsulation resin 50 and the semiconductor element 30.

It should be apparent to those skilled in the art that the foregoing embodiments may be implemented in many other specific forms without departing from the scope of this disclosure. Particularly, it should be understood that the foregoing embodiments may be implemented in the following forms.

The embodiment described above may be modified as follows. The embodiment and the following modified examples may be combined as long as the combined modified examples remain technically consistent with each other.

Figure 8:
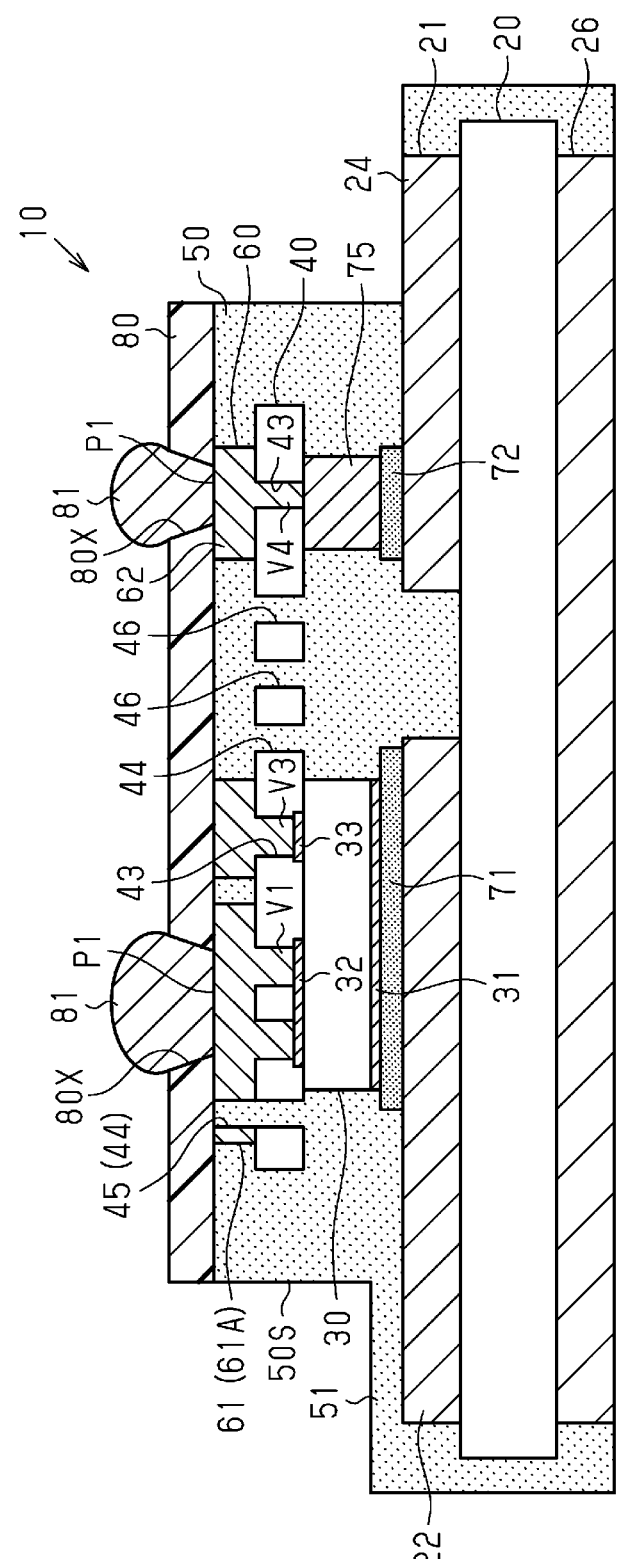
FIG. 8 is a schematic cross-sectional view illustrating a modified example of a semiconductor device.

As illustrated in FIG. 8, a solder resist layer 80 may be formed on the upper surface of the encapsulation resin 50 to cover the upper surface of the wiring layer 60. In an example, the solder resist layer 80 covers the upper surface of the encapsulation resin 50, which is flush with the upper surface of the wiring layer 60. In an example, the solder resist layer 80 includes openings 80X that extend through the solder resist layer 80 in the thickness-wise direction and partially expose the upper surface of the wiring layer 60 as external connection pads P1.

In this structure, the upper surface of the wiring layer 60 is flush with the upper surface of the encapsulation resin 50. This allows the solder resist layer 80, which is formed on the upper surfaces of the wiring layer 60 and the encapsulation resin 50, to have a uniform thickness.

As illustrated in FIG. 8, external connection terminals 81 may be disposed on the upper surface of the wiring layer 60 exposed in the bottom of the openings 80X, that is, the external connection pads P1. The external connection terminals 81 are used when the semiconductor device 10 is mounted on a mount substrate such as a motherboard (not illustrated). An example of the external connection terminal 81 is a connection terminal that is electrically connected to a pad on the mount substrate. The external connection terminal 81 may be, for example, a solder ball or a lead pin. In this modified example, a solder ball is used as the external connection terminal 81.

Figure 9:
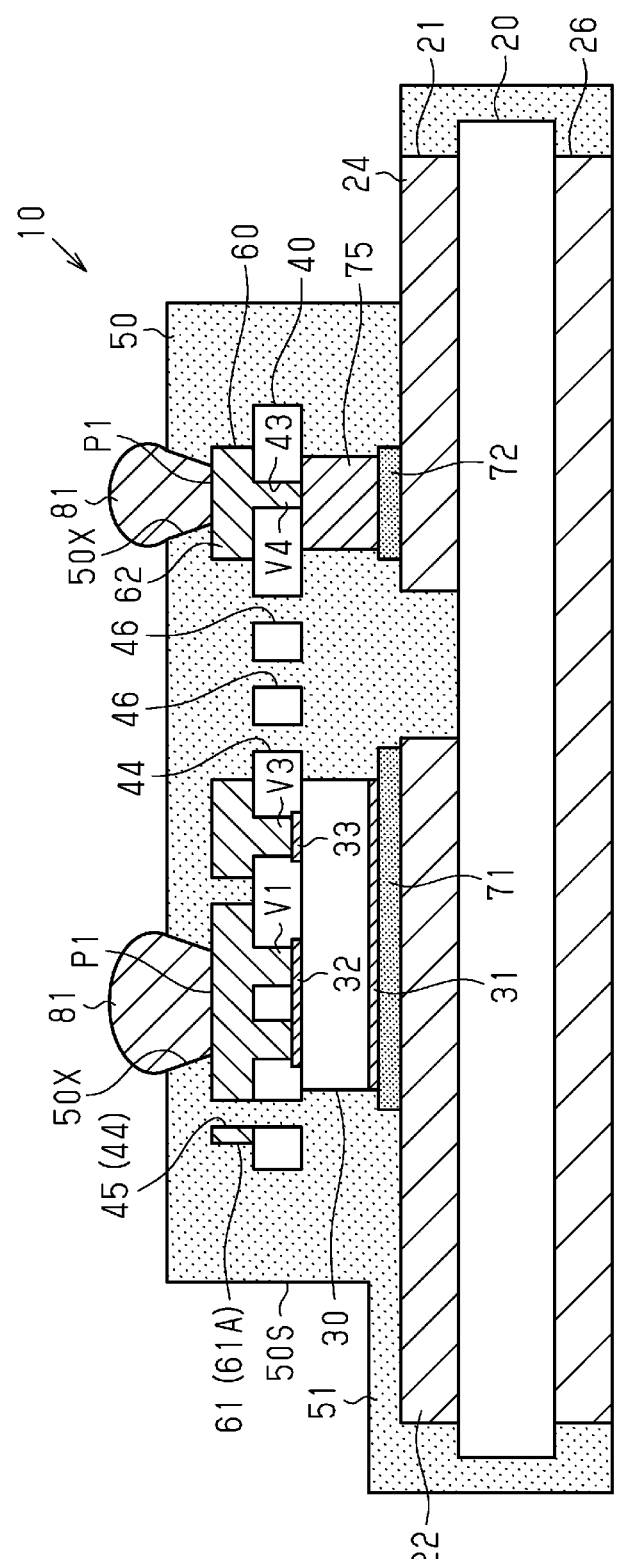
FIG. 9 is a schematic cross-sectional view illustrating a further modified example of a semiconductor device (cross-sectional view taken along line 9-9 in FIG. 10)

As illustrated in FIG. 9, the upper surface of the wiring layer 60 may be covered by the encapsulation resin 50. In an example, the encapsulation resin 50 includes openings 50X that partially expose the upper surface of the wiring layer 60 as the external connection pads P1. The external connection terminals 81 may be disposed on the external connection pads P1.

Figure 10:
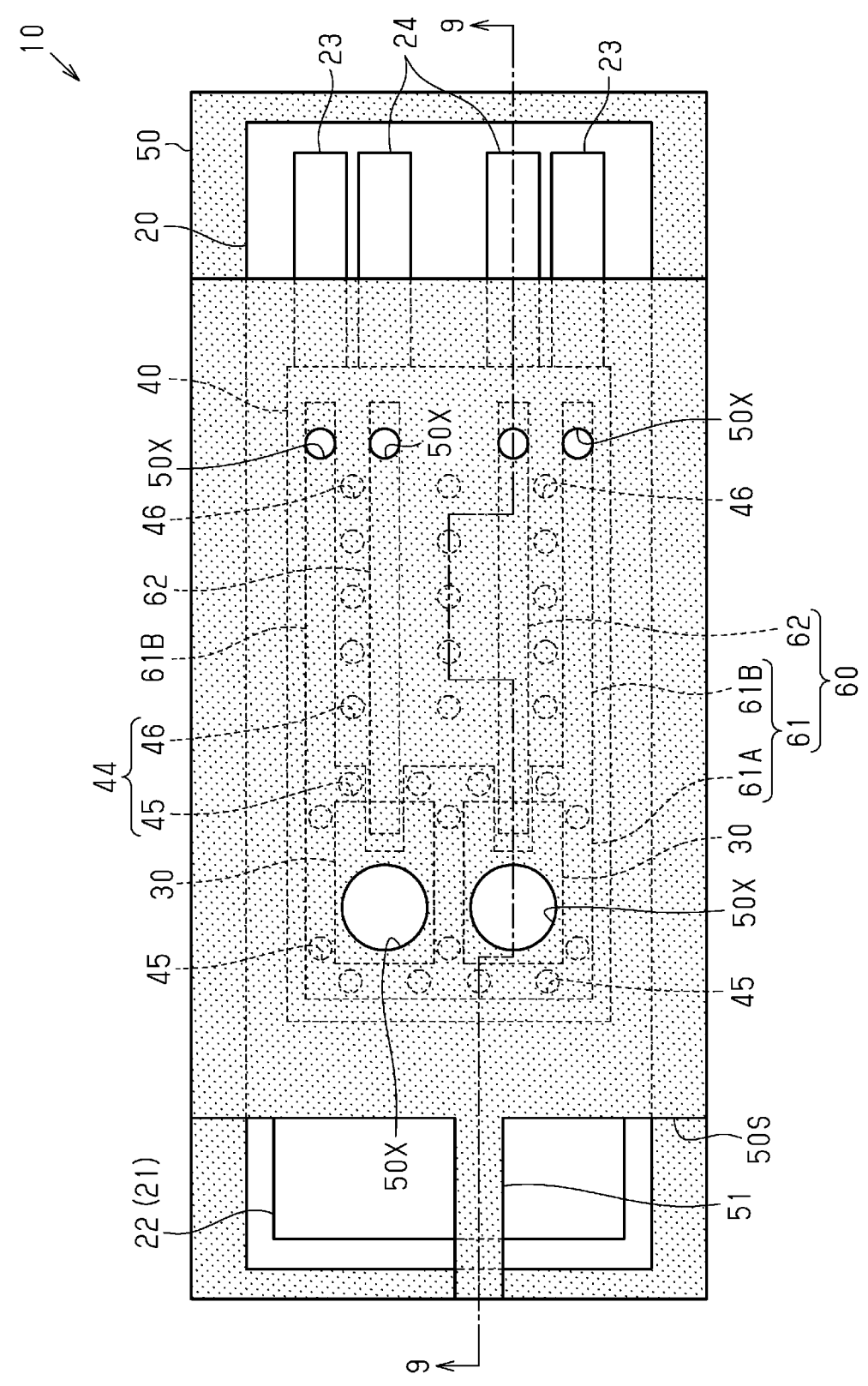
FIG. 10 is a schematic plan view of the semiconductor device illustrated in FIG. 9.

As illustrated in FIG. 10, in an example, the openings 50X partially expose the upper surface of the main body 61A of the wiring pattern 61. In an example, the openings 50X partially expose the upper surface of the distal portion of each extension 61B of the wiring pattern 61. In an example, the openings 50X partially expose the upper surface of the second end of each wiring pattern 62. Each opening 50X may have any planar shape and any planar size. In an example, the planar shape of the opening 50X is circular. The openings 80X illustrated in FIG. 8 are formed in the same manner as the openings 50X.

In this structure, the upper surface of the wiring layer 60 is covered by the encapsulation resin 50, and the openings 50X are formed in the encapsulation resin 50. Therefore, the solder resist layer 80 illustrated in FIG. 8 may be omitted.

Figure 11:
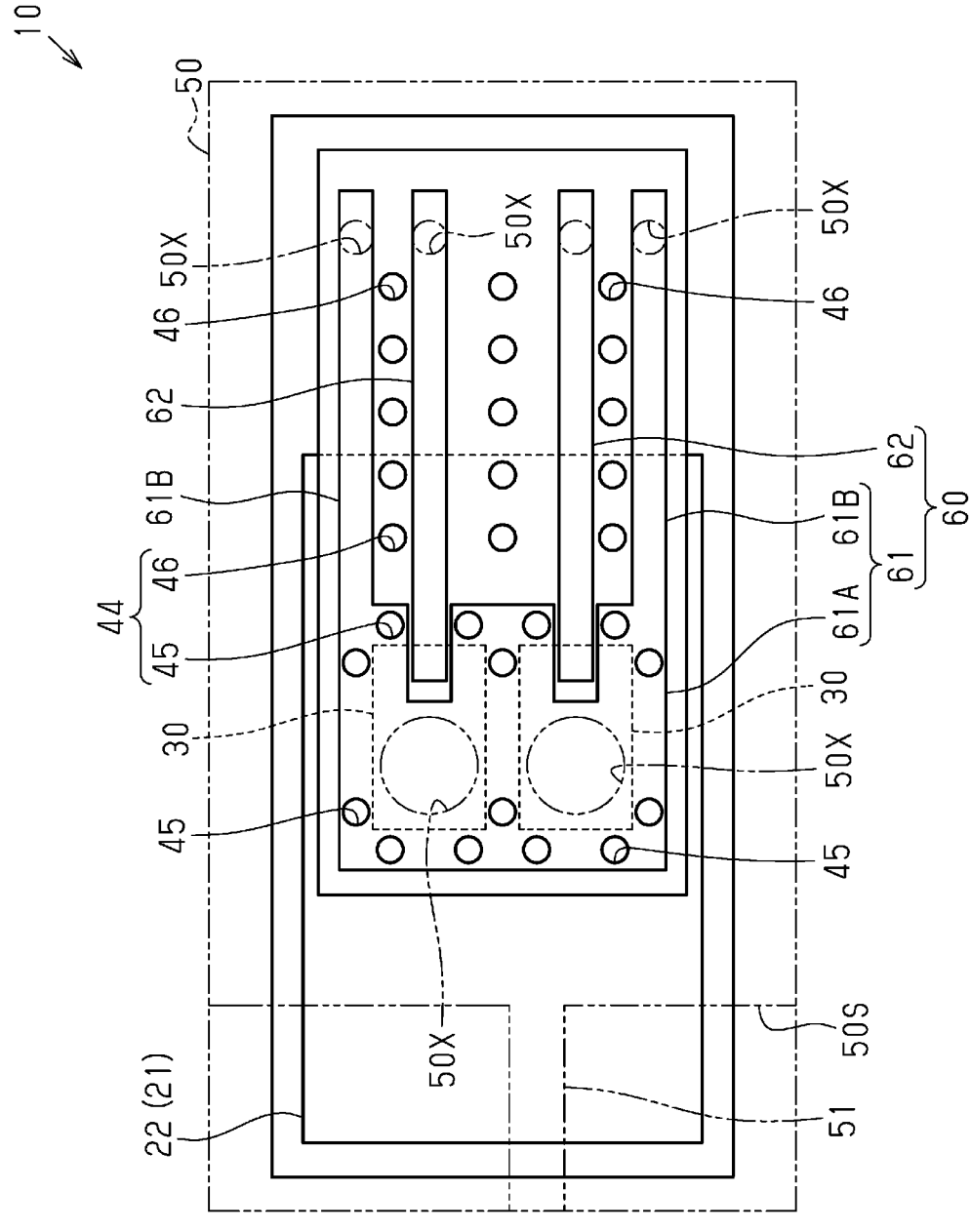
FIG. 11 is a schematic plan view illustrating a further modified example of a semiconductor device.

As illustrated in FIG. 11, the wiring patterns 23 and 24 may be omitted from the upper surface of the lower substrate 20. That is, the wiring patterns 23 and 24 that draw the wiring patterns 61 and 62, which are electrically connected to the electrode pads 32 and 33 (refer to FIG. 1A) of the semiconductor elements 30, to the outside of the encapsulation resin 50 may be omitted. In this case, the connection members 75 illustrated in FIG. 1A may be omitted. Also, in this case, for example, the wiring patterns 61 and 62 exposed from the openings 50X may be used as test pads. Alternatively, besides the openings 50X, the encapsulation resin 50 and the solder resist layer 80 (refer to FIG. 8) may have openings that partially expose the upper surfaces of the wiring patterns 61 and 62 as the test pads.

In the embodiment, the wiring pattern 22 does not have to include the portion that is drawn to the outside of the encapsulation resin 50. The wiring pattern 22 also does not have to include the portion that is drawn to the outside of the upper substrate 40.

In the embodiment, the planar shape of the upper substrate 40 is smaller than the planar shape of the lower substrate 20. However, there is no limitation to such a configuration. For example, the planar shape of the upper substrate 40 may larger than the planar shape of the lower substrate 20.

Figure 12:
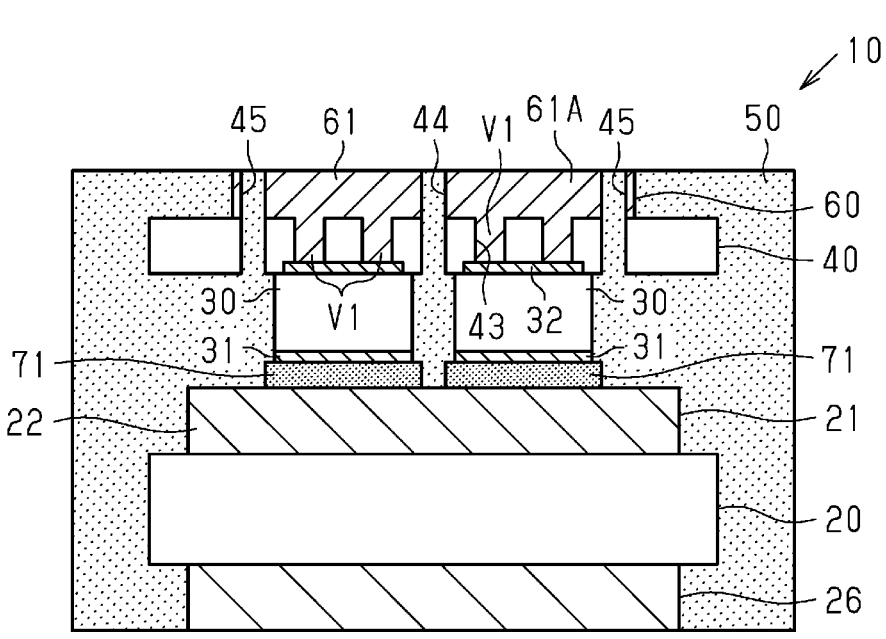
FIG. 12 is a schematic cross-sectional view illustrating a further modified example of a semiconductor device.

Alternatively, for example, as illustrated in FIG. 12, the planar shape of the upper substrate 40 and the planar shape of the lower substrate 20 may have the same size. In an example, the upper substrate 40 and the lower substrate 20 may have the same planar shape and the same planar size. In this modified example, in plan view, the entirety of the upper substrate 40 overlaps the lower substrate 20.

In the embodiment, the encapsulation resin 50 that encapsulates the semiconductor elements 30 disposed between the lower substrate 20 and the upper substrate 40 is formed to cover the upper surface of the upper substrate 40 and fill the through holes 44. In other words, the portion of the encapsulation resin encapsulating the semiconductor elements 30, the portion of the encapsulation resin covering the upper surface of the upper substrate 40, and the portion of the encapsulation resin filling the through holes 44 are integrally formed of a single layer of the encapsulation resin 50. However, there is no limitation to such a configuration.

Figure 13:
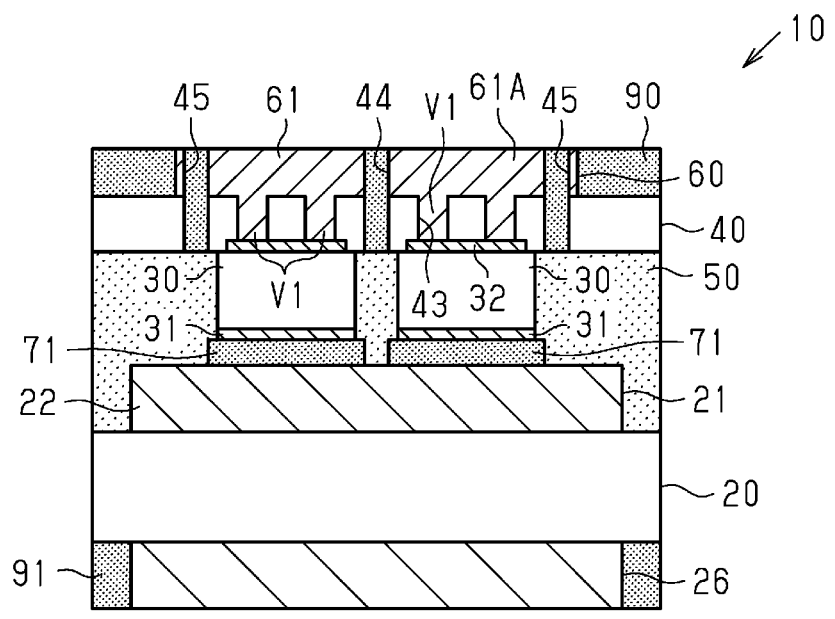
FIG. 13 is a schematic cross-sectional view illustrating a further modified example of a semiconductor device.

In an example, as illustrated in FIG. 13, besides the encapsulation resin 50 encapsulating the semiconductor elements 30, a covering resin 90 may be disposed to cover the upper surface of the upper substrate 40 and fill the through holes 44. In other words, the encapsulation resin 50, which encapsulates the semiconductor elements 30, and the covering resin 90, which covers the upper surface of the upper substrate 40 and fills the through holes 44, may be formed of different members. The material of the covering resin 90 may differ from, for example, the material of the encapsulation resin 50 or be the same as the material of the encapsulation resin 50. The material of the covering resin 90 may have, for example, a coefficient of thermal expansion similar to that of the encapsulation resin 50. In this specification, "similar" as in "coefficient of thermal expansion similar" means that the difference in coefficient of thermal expansion between the encapsulation resin 50 and the covering resin 90 is included in a range that is less than or equal to 10 ppm/° C. The coefficient of thermal expansion of the covering resin 90 may be in a range of, for example, 5 ppm/° C. to 28 ppm/° C. In an example, the coefficient of thermal expansion of the covering resin 90 is set so that the difference in coefficient of thermal expansion between the covering resin 90 and the encapsulation resin 50 is less than the difference in coefficient of thermal expansion between the covering resin 90 and the semiconductor elements 30. In an example, the coefficient of thermal expansion of the covering resin 90 is set so that the difference in coefficient of thermal expansion between the covering resin 90 and the encapsulation resin 50 is less than the difference in coefficient of thermal expansion between the covering resin 90 and the upper substrate 40. The material of the covering resin 90 may be, for example, a non-photosensitive insulative resin containing a thermosetting resin as a main component. The material of the covering resin 90 may be, for example, an insulative resin, such as epoxy resin and polyimide resin, or a resin material obtained by mixing the resin with a filler such as silica and alumina. The covering resin 90 may be, for example, a mold resin, an underfill resin, or a potting resin. The covering resin 90 may be formed, for example, through a resin molding process or a potting process.

In this modified example, the covering resin 90 covers the upper surface of the upper substrate 40 and fills the through holes 44. In an example, the covering resin 90 covers the entirety of the upper surface of the encapsulation resin 50 exposed in the bottom of the through holes 44. In an example, the covering resin 90 covers the entirety of the upper surface of the upper substrate 40 exposed from the wiring layer 60. In an example, the covering resin 90 covers the entirety of the side surfaces of the wiring layer 60. The covering resin 90 is in contact with the side surfaces of the wiring layer 60. In an example, the covering resin 90 exposes the upper surface of the wiring layer 60. In an example, the upper surface of the covering resin 90 is flush with the upper surface of the wiring layer 60.

In this structure, the upper substrate 40 is sandwiched from above and below by the encapsulation resin 50, which encapsulates the semiconductor elements 30 disposed between the lower substrate 20 and the upper substrate 40, and the covering resin 90, which covers the upper surface of the upper substrate 40. In addition, the covering resin 90 filling the through holes 44 covers the upper substrate 40 including the wall surfaces defining the through holes 44. The encapsulation resin 50 and the covering resin 90 physically restrict movement of the upper substrate 40 in various directions. This reduces strain of the upper substrate 40 caused by the difference in coefficient of thermal expansion between the semiconductor element 30 and the upper substrate 40, for example, when the semiconductor device 10 is heated during a temperature cycle test or the like. As a result, separation of the upper substrate 40 from the semiconductor element 30 is appropriately limited.

The encapsulation resin 50 and the covering resin 90 are formed of separate members. This increases the degree of freedom for selecting materials of the encapsulation resin 50 and the covering resin 90. The encapsulation resin 50 and the covering resin 90 are formed of separate members. This increases the degree of freedom for shapes of the encapsulation resin 50 and the covering resin 90.

In the modified example illustrated in FIG. 13, the upper surface of the covering resin 90 is flush with the upper surface of the wiring layer 60. Instead, the covering resin 90 may cover the upper surface of the wiring layer 60. In this case, for example, openings are formed in the covering resin 90 to partially expose the upper surface of the wiring layer 60 as external connection pads.

Alternatively, the upper surface of the covering resin 90 may be located at a lower position than the upper surface of the wiring layer 60. In this case, the covering resin 90 partially covers the side surfaces of the wiring layer 60 in the stacking direction of the semiconductor device 10 (vertical direction in FIG. 13). In other words, the covering resin 90 exposes an upper part of the side surfaces of the wiring layer 60 in the stacking direction of the semiconductor device 10.

As illustrated in FIG. 13, besides the encapsulation resin 50 encapsulating the semiconductor elements 30, an insulation resin 91 may be disposed to cover the lower surface of the lower substrate 20. That is, the encapsulation resin 50 encapsulating the semiconductor elements 30 and the insulation resin 91 covering the lower surface of the lower substrate 20 may be formed of separate members. The material of the insulation resin 91 may differ from, for example, the material of the encapsulation resin 50 or be the same as the material of the encapsulation resin 50. The material of the insulation resin 91 may have, for example, a coefficient of thermal expansion similar to that of the encapsulation resin 50. The coefficient of thermal expansion of the insulation resin 91 may be in a range of, for example, 5 ppm/° C. to 28 ppm/° C. The material of the insulation resin 91 may be, for example, the same as the material of the covering resin 90. The insulation resin 91 may be formed, for example, through a resin molding process or a potting process.

In an example, the insulation resin 91 covers a side surface of the metal layer 26. In an example, the insulation resin 91 covers the entirety of the side surfaces of the metal layer 26. In an example, the insulation resin 91 exposes the lower surface of the metal layer 26. In an example, the lower surface of the insulation resin 91 is flush with the lower surface of the metal layer 26. In an example, the insulation resin 91 covers the entirety of the lower surface of the lower substrate 20 exposed from the metal layer 26.

In the modified example illustrated in FIG. 13, the insulation resin 91 may cover the lower surface of the metal layer 26.

In the embodiment, the encapsulation resin 50 may be formed to cover the lower surface of the metal layer 26.

In the embodiment, the encapsulation resin 50 covers the side surfaces of the lower substrate 20. Instead, for example, as illustrated in FIG. 13, the encapsulation resin 50 may expose the side surfaces of the lower substrate 20. In this case, for example, the side surfaces of the encapsulation resin 50 are flush with the side surfaces of the lower substrate 20. In the modified example illustrated in FIG. 13, the side surfaces of the insulation resin 91 covering the lower surface of the lower substrate 20 are flush with the side surfaces of the lower substrate 20.

In the embodiment, the encapsulation resin 50 covers the side surfaces of the upper substrate 40. Instead, for example, as illustrated in FIG. 13, the encapsulation resin 50 may expose the side surfaces of the upper substrate 40. In this case, for example, the side surfaces of the encapsulation resin 50 are flush with the side surfaces of the upper substrate 40. In the modified example illustrated in FIG. 13, the side surfaces of the covering resin 90 formed on the upper surface of the upper substrate 40 are flush with the side surfaces of the upper substrate 40.

In the modified example illustrated in FIG. 13, the encapsulation resin 50, which encapsulates the semiconductor elements 30, the covering resin 90, which covers the upper surface of the upper substrate 40 and fills the through holes 44, and the insulation resin 91, which covers the lower surface of the lower substrate 20, are formed of separate members. Instead, for example, among the encapsulation resin 50, the covering resin 90, and the insulation resin 91, the encapsulation resin 50 and the covering resin 90 may be formed integrally with each other. In an example in which the encapsulation resin 50 and the covering resin 90 are formed so that the side surfaces of the upper substrate 40 are exposed, the side surfaces of the upper substrate 40 are covered by a mold when forming the encapsulation resin 50 and the covering resin 90. If the upper substrate 40 does not include the second through holes 46, the encapsulation resin 50 and the covering resin 90 need to be formed separately. In this regard, in the semiconductor device 10 illustrated in FIG. 13, the upper substrate 40 includes the second through holes 46 (refer to FIGS. 1A and 1B). When the encapsulation resin 50 flows into the space between the lower substrate 20 and the upper substrate 40, the encapsulation resin 50 is distributed to the upper surface of the upper substrate 40 through the second through holes 46. The encapsulation resin 50 that has been distributed to the upper surface of the upper substrate 40 through the second through holes 46 covers the upper surface of the upper substrate 40 and the side surfaces of the wiring layer 60. This eliminates the need for separately forming the encapsulation resin 50 and the covering resin 90. The encapsulation resin 50 and the covering resin 90 are formed integrally. In other words, even when the entirety of the side surfaces of the upper substrate 40 is not encapsulated and is exposed in the semiconductor device 10, the upper surface and the lower surface of the upper substrate 40 is integrally encapsulated by the single encapsulation resin 50.

In the modified example illustrated in FIG. 13, the insulation resin 91 may cover the side surfaces of the lower substrate 20.

In the modified example illustrated in FIG. 13, the covering resin 90 may cover the side surfaces of the upper substrate 40.

In the modified example illustrated in FIG. 13, the covering resin 90 covers the entirety of the upper surface of the upper substrate 40 exposed from the wiring layer 60.

Figure 14:
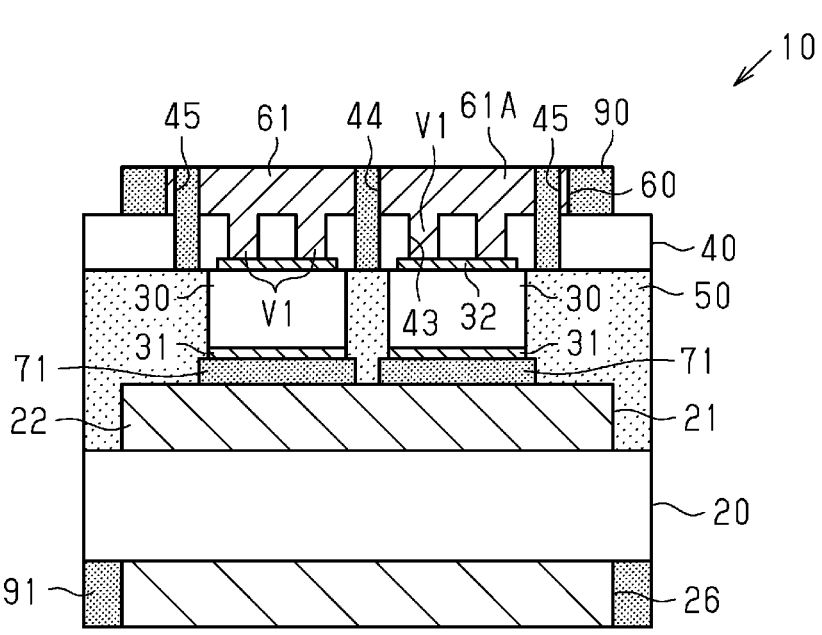
FIG. 14 is a schematic cross-sectional view illustrating a further modified example of a semiconductor device (cross-sectional view taken along line 14-14 in FIG. 15)

Instead, for example, as illustrated in FIG. 14, the covering resin 90 may partially cover only the upper surface of the upper substrate 40 exposed from the wiring layer 60.

Even in this case, the covering resin 90 fills the through holes 44. In this modified example, the covering resin 90 is in contact with the side surfaces of the wiring layer 60 and covers the side surfaces of the wiring layer 60.

Figure 15:
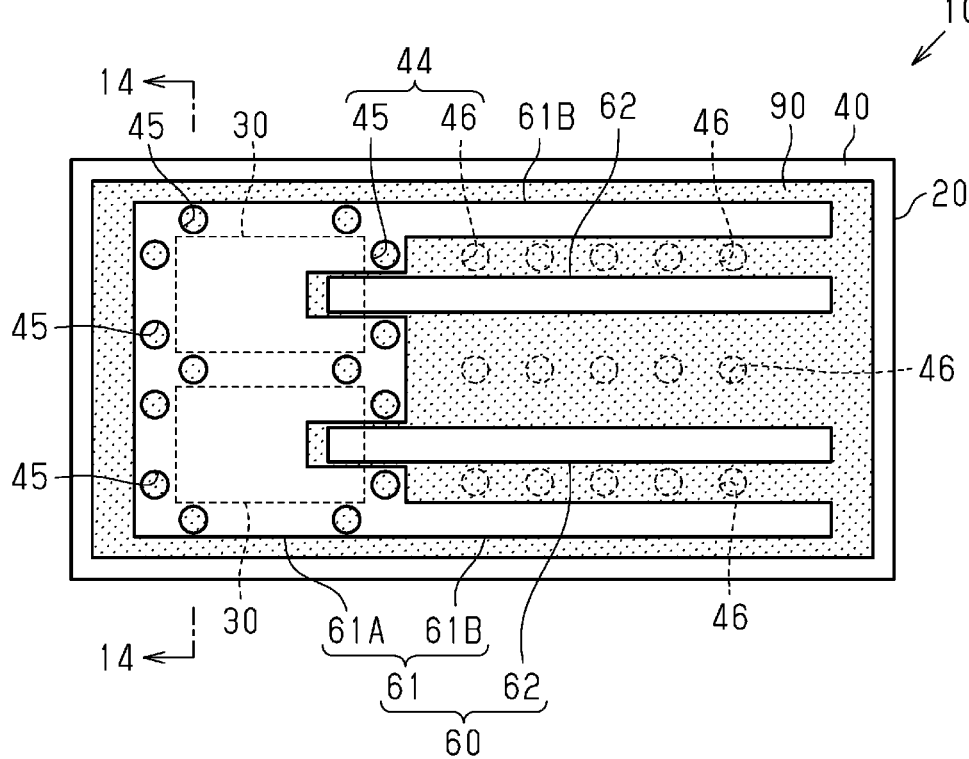
FIG. 15 is a schematic plan view of the semiconductor device illustrated in FIG. 14.

In an example, as illustrated in FIG. 15, in plan view, the covering resin 90 may surround the periphery of the wiring patterns 61 and 62. In this modified example, the covering resin 90 partially exposes the upper surface of the upper substrate 40. In an example, the covering resin 90 exposes the peripheral edges of the upper surface of the upper substrate 40.

The structure described above also obtains the advantages (1) to (10) of the embodiment. In addition, since the amount of the covering resin 90 is reduced, the manufacturing cost of the semiconductor device 10 is reduced.

The insulation resin 91 illustrated in FIGS. 13 and 14 may be omitted.

Figure 16:
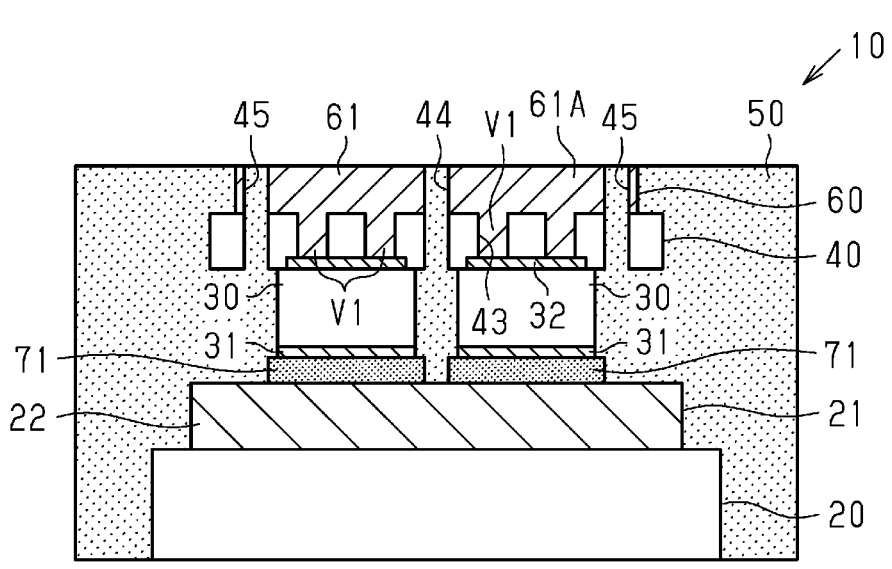
FIG. 16 is a schematic cross-sectional view illustrating a further modified example of a semiconductor device.

As illustrated in FIG. 16, the metal layer 26 may be omitted.

As illustrated in FIG. 16, the encapsulation resin 50 may expose the lower surface of the lower substrate 20.

Figure 17:
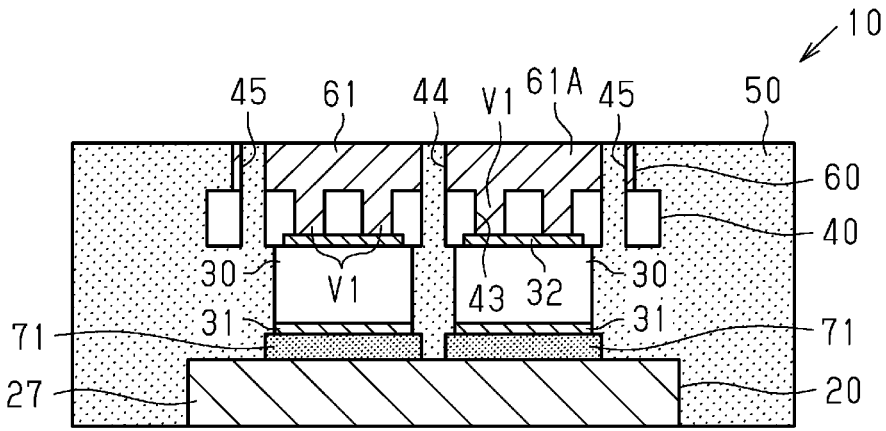
FIG. 17 is a schematic cross-sectional view illustrating a further modified example of a semiconductor device.

As illustrated in FIG. 17, the lower substrate 20 may be formed of a metal plate 27. In this case, for example, the semiconductor elements 30 are mounted on the upper surface of the metal plate 27. The material of the metal plate 27 may be, for example, copper or a copper alloy. A surface-processed layer may be formed on the surface of the metal plate 27 where appropriate. The surface-processed layer may be a metal layer such as an Au layer, a Ni layer/Au layer, and a Ni layer/Pd layer/Au layer. The coefficient of thermal expansion of the metal plate 27 may be in a range of, for example, 15 ppm/° C. to 18 ppm/° C.

In this structure, since the lower substrate 20 is formed of the metal plate 27, the overall heat dissipation performance of the semiconductor device 10 is improved.

The metal plate 27 illustrated in FIG. 17 may be used as a wiring or an electrode. That is, the lower substrate 20 may be formed of a wiring or an electrode.

Figures 18, 19:
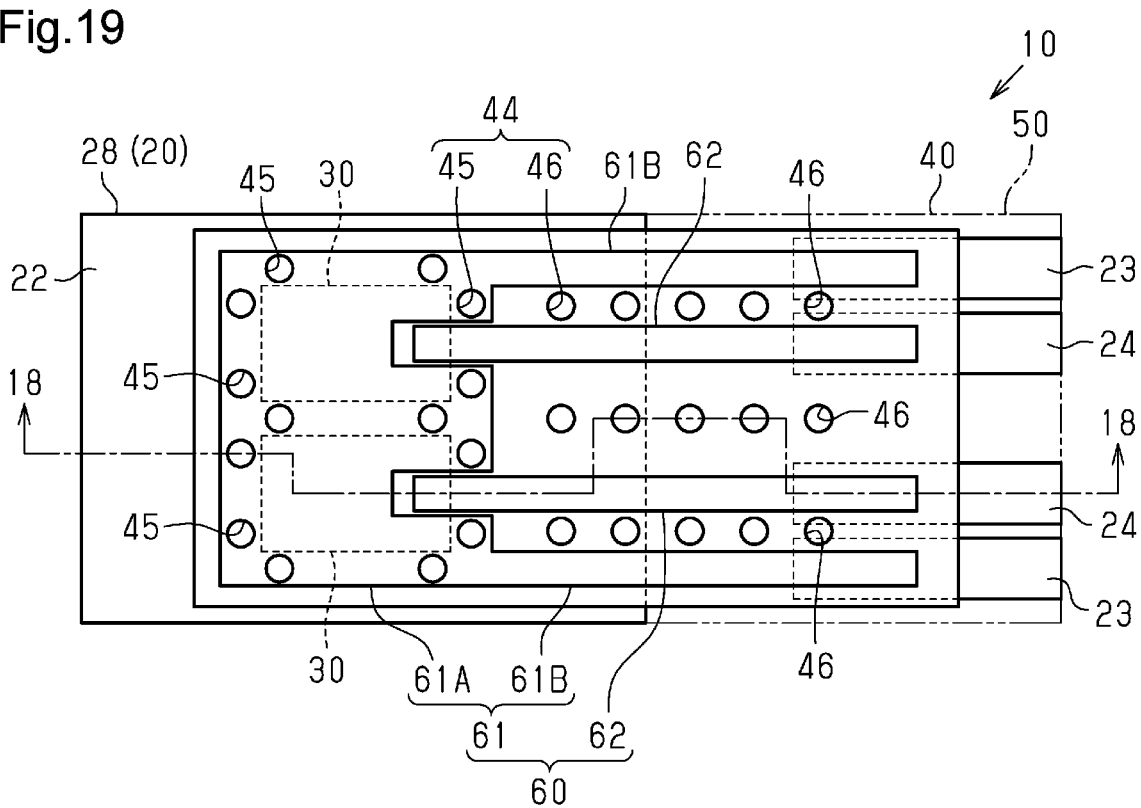
FIG. 18 is a schematic cross-sectional view illustrating a further modified example of a semiconductor device (cross-sectional view taken along line 18-18 in FIG. 19)
FIG. 19 is a schematic plan view of the semiconductor device illustrated in FIG. 18.

In an example, as illustrated in FIGS. 18 and 19, the lower substrate 20 may be formed of a wiring layer 28. In this structure, the wiring layer 28 serves as the lower substrate 20. Thus, in compared to a structure in which a wiring layer is formed on the lower substrate 20 formed of a ceramic substrate, the ceramic substrate and the like are omitted. This reduces the thickness of the semiconductor device 10.

As illustrated in FIG. 19, the wiring layer 28 includes, for example, wiring patterns 22, 23, and 24. The wiring patterns 22, 23, and 24 are, for example, arranged separately from each other on the same plane. The coefficient of thermal expansion of the wiring patterns 22, 23, and 24 may be in a range of, for example, 15 ppm/° C. to 18 ppm/° C. In this modified example, outer side surfaces of the wiring layer 28 are exposed from the encapsulation resin 50. The outer side surfaces of the wiring patterns 22, 23, and 24 are flush with the outer side surfaces of the encapsulation resin 50. Thus, in this modified example, the wiring patterns 22, 23, and 24 are not drawn to the outside of the encapsulation resin 50. As a result, the planar shape of the semiconductor device 10 is reduced in size overall.

As illustrated in FIG. 18, in this modified example, the lower surface of the wiring layer 28 is exposed from the encapsulation resin 50. The lower surface of the wiring layer 28 is flush with the lower surface of the encapsulation resin 50. Thus, the side surfaces and the lower surface of the wiring layer 28 are exposed from the encapsulation resin 50. This improves the overall heat dissipation performance of the semiconductor device 10.

In the modified example illustrated in FIG. 18, the encapsulation resin 50 may cover outer side surfaces of the wiring layer 28.

In the modified example illustrated in FIG. 18, the wiring patterns 22, 23, and 24 may be drawn to the outside of the encapsulation resin 50.

In the modified example illustrated in FIG. 18, the lower surface of the wiring layer 28 may be covered by the encapsulation resin 50. The lower surface of the wiring layer 28 may be covered by a solder resist layer. In this case, the encapsulation resin 50 or the solder resist layer may have an opening that partially exposes the lower surface of the wiring layer 28 as an electrode pad.

In the embodiment, the structure of the first through hole 45 is not particularly limited. In an example, the wall surface defining the first through hole 45 may extend orthogonal to the upper surface of the upper substrate 40.

In the embodiment, the structure of the first through hole 46 is not particularly limited. In an example, the wall surface defining the second through hole 46 may extend orthogonal to the upper surface of the upper substrate 40.

In the embodiment, the number of through holes 44 and locations of the through holes 44 are not particularly limited. In an example, in plan view, the through holes 44 may be arranged in the vicinity of the main body 61A of the wiring pattern 61.

In the embodiment, the two first through holes 45 are arranged between the two semiconductor elements 30 and shared by the two semiconductor elements 30.

Figure 20:
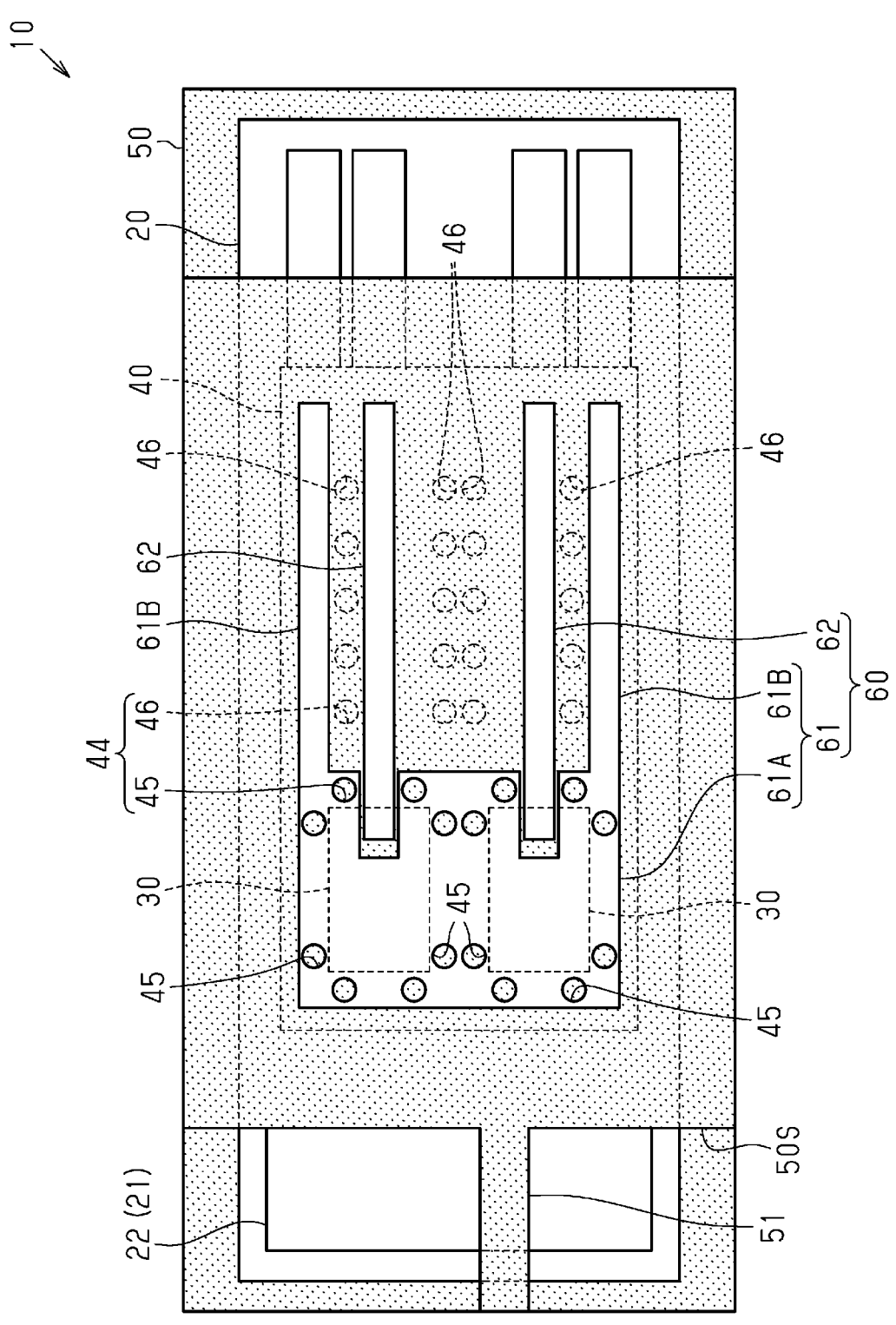
FIG. 20 is a schematic plan view illustrating a further modified example of a semiconductor device.

In an example, as illustrated in FIG. 20, first through holes 45 may be separately arranged for the lower side of the semiconductor element 30 that is located at the upper part in FIG. 20 and for the upper side of the semiconductor element 30 that is located at the lower part in FIG. 20. In this modified example, two first through holes 45 are arranged in the upper substrate 40 for each of the lower side of the semiconductor element 30 located at the upper part in FIG. 20 and the upper side of the semiconductor element 30 located at the lower part in FIG. 20. That is, in this modified example, four first through holes 45 are arranged in the upper substrate 40 between the two semiconductor elements 30.

In the embodiment, the five second through holes 46 are arranged between the two wiring patterns 62 and shared by the two wiring patterns 62.

Instead, for example, as illustrated in FIG. 20, second through holes 46 may be separately arranged for the wiring pattern 62 that is located at the upper part in FIG. 20 and for the wiring pattern 62 that is located at a lower part in FIG. 20. In this modified example, five second through holes 46 are arranged in the upper substrate 40 for each of the wiring pattern 62 located at the upper part in FIG. 20 and the wiring pattern 62 located at the lower part in FIG. 20. That is, in this modified example, ten second through holes 46 are arranged in the upper substrate 40 between the two wiring patterns 62.

In the embodiment, the second through holes 46 are arranged next to one another in the upper substrate 40 in the extension direction of the extensions 61B and the wiring patterns 62.

Figure 21:
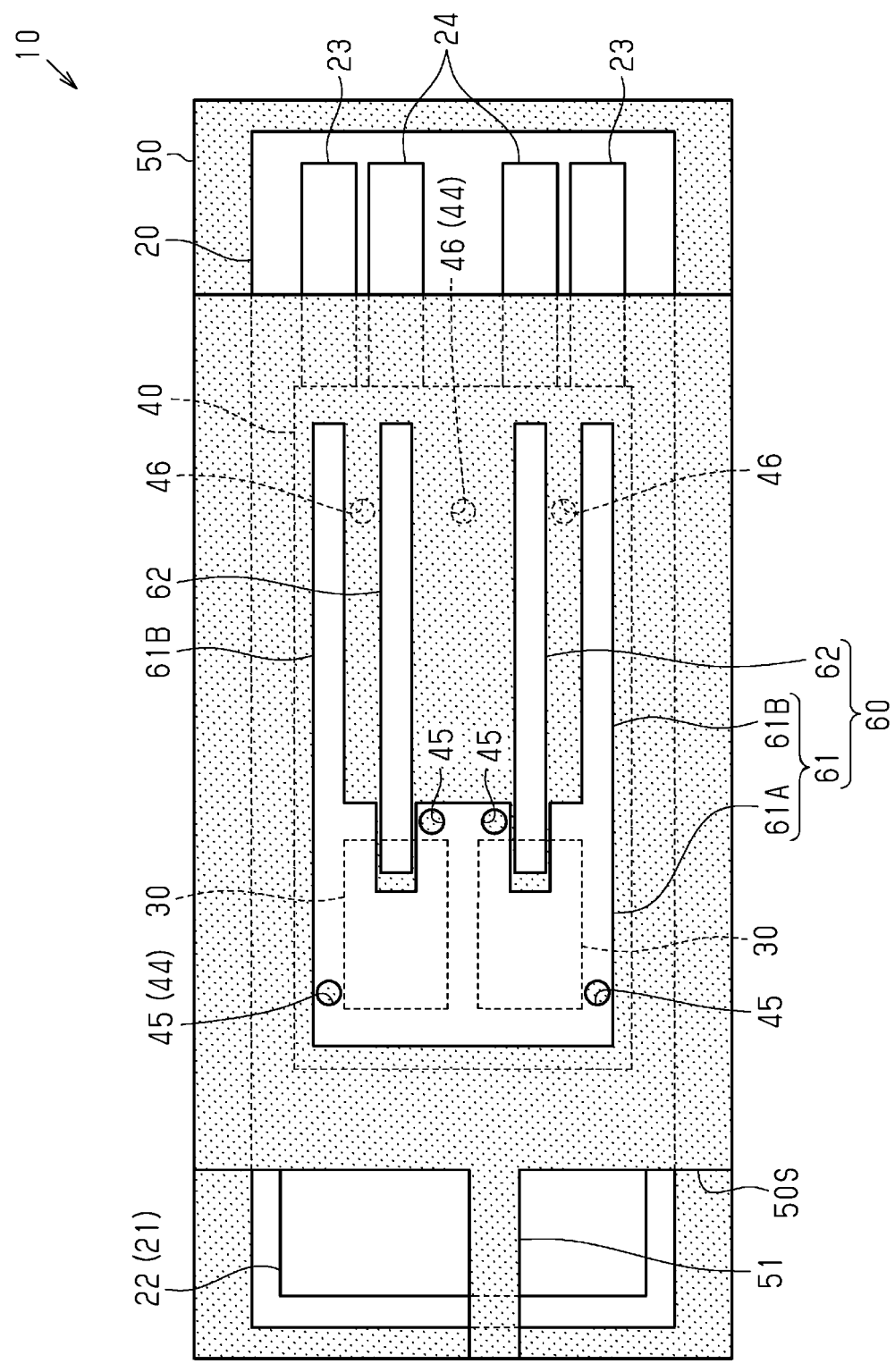
FIG. 21 is a schematic plan view illustrating a further modified example of a semiconductor device.

Instead, for example, as illustrated in FIG. 21, the second through holes 46 may be arranged in the vicinity of only the distal ends of the extensions 61B and the second ends of the wiring patterns 62 in plan view. In an example, the second through holes 46 may be arranged in the vicinity of only the connection members 75 (refer to FIG. 1A) in plan view.

In the embodiment, two of the first through holes 45 are arranged in the upper substrate 40 for each of the four corners of the semiconductor element 30. Instead, for example, each of the four corners of the semiconductor element 30 may be provided with one first through hole 45. In an example, the first through holes 45 may be arranged corresponding to only some of the four corners of each semiconductor element 30.

In an example, as illustrated in FIG. 21, the first through holes 45 may be arranged corresponding to two of the four corners of each semiconductor element 30 located on one of the diagonals.

Figure 22:
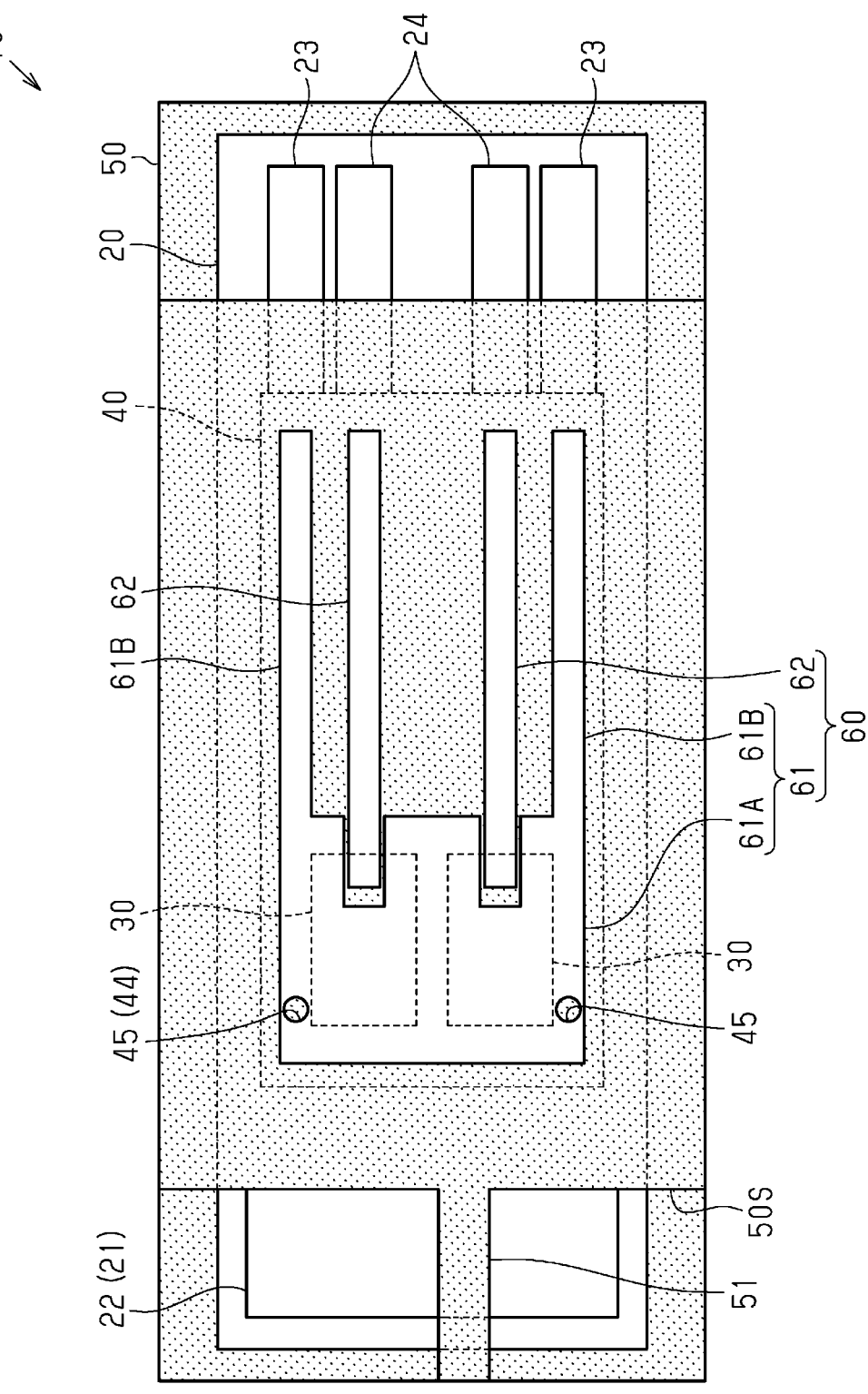
FIG. 22 is a schematic plan view illustrating a further modified example of a semiconductor device.

In an example, as illustrated in FIG. 22, the first through holes 45 may be arranged in the vicinity of only the corner of the semiconductor element 30 on which the thermal stress is most likely to concentrate among the four corners. That is, the first through holes 45 may be arranged in the vicinity of only the corner of the semiconductor element 30 that is located closest to the one of the four corners of the upper substrate 40 in plan view.

In the embodiment, in plan view, the first through holes 45 are arranged in the upper substrate 40 in the vicinity of the corners of each semiconductor element 30. However, the positions of the first through holes 45 are not particularly limited as long as the first through holes 45 are located in a region surrounding the semiconductor element 30 in plan view.

In an example, as illustrated in FIG. 22, the second through holes 46 may be omitted from the through holes 44.

In the embodiment, two semiconductor elements 30 are mounted on the upper surface of the lower substrate 20. However, the number of semiconductor elements 30 is not particularly limited. In an example, one semiconductor element 30 may be mounted on the upper surface of the lower substrate 20. Three or more semiconductor elements 30 may be mounted on the upper surface of the lower substrate 20.

In the embodiment, the substrate body 41 of the upper substrate 40 has a single layer but is not limited to the single layer. Instead, for example, the substrate body 41 may have a stacked structure in which one or more wiring layers and multiple insulation layers are stacked.

In the embodiment, the semiconductor device 10 is embodied in a power semiconductor device. Alternatively, for example, the semiconductor device 10 may be embodied in a semiconductor device other than a power semiconductor device. For example, as long as the semiconductor device 10 includes the encapsulation resin 50 encapsulating the semiconductor elements 30 disposed between the lower substrate 20 and the upper substrate 40 and the wiring layer 60 formed on the upper surface of the upper substrate 40, the remaining structures and functions are not particularly limited.

In the embodiment, the semiconductor element 30 is embodied in a power semiconductor element. Alternatively, for example, the semiconductor element 30 may be embodied in a semiconductor element other than a power semiconductor element.

In the embodiment, the semiconductor element 30 includes the three electrode pads 31, 32, and 33. However, the number of electrode pads 31, 32, and 33 is not particularly limited. For example, the semiconductor element 30 may be embodied in a semiconductor element including two electrode pads. In this case, when the two electrode pads are disposed on only the upper surface of the semiconductor element, the wiring pattern 22 may be omitted. In this case, for example, the semiconductor element 30 is mounted on the upper surface of the lower substrate 20 via the bonding portion 71.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A semiconductor device, comprising:
a lower substrate;
a semiconductor element mounted on an upper surface of the lower substrate;
an upper substrate disposed on an upper surface of the semiconductor element;
one or more through holes extending through the upper substrate in a thickness-wise direction;
an encapsulation resin disposed between the lower substrate and the upper substrate and encapsulating the semiconductor element;
a wiring layer disposed on an upper surface of the upper substrate; and
a covering resin covering the upper surface of the upper substrate and filling the through holes, wherein
the upper substrate includes a substrate body and an adhesive layer, the adhesive layer being adhered to the upper surface of the semiconductor element and a lower surface of the upper substrate,
the through holes extend through the substrate body and the adhesive layer in the thickness-wise direction, and
the wiring layer has a thickness that is greater than that of the substrate body.

2. The semiconductor device according to claim 1, wherein the one or more through holes include one or more first through holes arranged in the vicinity of the semiconductor element in plan view, the first through holes extend through the wiring layer and the upper substrate in the thickness-wise direction, and the covering resin fills the first through holes.

3. The semiconductor device according to claim 2, wherein the semiconductor element is rectangular in plan view, and the first through holes are arranged adjacent to at least one side of the semiconductor element or at least one corner of the semiconductor element in plan view.

4. The semiconductor device according to claim 3, wherein the upper substrate is rectangular in plan view, the semiconductor element is disposed proximate to one of four corners of the upper substrate in plan view, and the first through holes are arranged in the vicinity of a corner of the semiconductor element that is located closest to the one of the four corners of the upper substrate in plan view.

5. The semiconductor device according to claim 3, wherein the first through holes are arranged in the vicinity of each of four corners of the semiconductor element in plan view.

6. The semiconductor device according to claim 3, wherein two of the first through holes are arranged for each of four sides of the semiconductor element in plan view.

7. The semiconductor device according to claim 1, wherein the one or more through holes include one or more second through holes arranged in the vicinity of the wiring layer without overlapping the wiring layer in plan view, the second through holes extend through the upper substrate in the thickness-wise direction, and the covering resin fills the second through holes.

8. The semiconductor device according to claim 7, wherein the second through holes are arranged adjacent to the wiring layer in plan view.

9. The semiconductor device according to claim 1, wherein the covering resin entirely covers the upper surface of the upper substrate exposed from the wiring layer and covers a side surface of the wiring layer.

10. The semiconductor device according to claim 1, wherein the covering resin covers an upper surface of the wiring layer, and the covering resin includes an opening that partially exposes the upper surface of the wiring layer.

11. The semiconductor device according to claim 1, wherein the encapsulation resin and the covering resin are formed continuously and integrally with each other.

12. The semiconductor device according to claim 1, wherein the encapsulation resin and the covering resin are formed from a same resin material.

13. The semiconductor device according to claim 1, wherein the encapsulation resin and the covering resin are formed from different resin materials.

14. The semiconductor device according to claim 1, wherein the upper substrate includes an opening extending through the substrate body and the adhesive layer to expose an electrode pad located on the upper surface of the semiconductor element, and the wiring layer fills the opening and is electrically connected to the electrode pad.

* * * * *